United States Patent
Yoshihara

(10) Patent No.: US 11,889,623 B2
(45) Date of Patent: Jan. 30, 2024

(54) METAL-CLAD LAMINATE, PRINTED CIRCUIT BOARD, AND METHOD OF MANUFACTURING SAME

(71) Applicant: KANEKA CORPORATION, Osaka (JP)

(72) Inventor: Shusuke Yoshihara, Hyogo (JP)

(73) Assignee: KANEKA CORPORATION, Osaka (JP)

(*) Notice: Subject to any disclaimer, the term of this patent is extended or adjusted under 35 U.S.C. 154(b) by 478 days.

(21) Appl. No.: 17/162,000

(22) Filed: Jan. 29, 2021

(65) Prior Publication Data

US 2021/0153346 A1 May 20, 2021

Related U.S. Application Data

(63) Continuation of application No. PCT/JP2019/029986, filed on Jul. 31, 2019.

(30) Foreign Application Priority Data

Jul. 31, 2018 (JP) ................................. 2018-144417

(51) Int. Cl.
| | |
|---|---|
| H05K 1/03 | (2006.01) |
| C08L 9/00 | (2006.01) |
| C08L 51/04 | (2006.01) |
| C08L 63/00 | (2006.01) |
| C08L 71/12 | (2006.01) |

(52) U.S. Cl.
CPC .............. *H05K 1/0366* (2013.01); *C08L 9/00* (2013.01); *C08L 51/04* (2013.01); *C08L 63/00* (2013.01); *C08L 71/123* (2013.01); *C08L 2207/53* (2013.01)

(58) Field of Classification Search
CPC ......... H05K 1/0366; C08L 9/00; C08L 51/04; C08L 63/00; C08L 71/123; C08L 2207/53
See application file for complete search history.

(56) References Cited

U.S. PATENT DOCUMENTS

| | | |
|---|---|---|
| 2011/0097568 A1 | 4/2011 | Kamae et al. |
| 2014/0127462 A1 | 5/2014 | Endo et al. |
| 2017/0354033 A1 | 12/2017 | Uchida et al. |
| 2018/0235090 A1 | 8/2018 | Onozeki et al. |
| 2019/0217576 A1 | 7/2019 | Kitai et al. |

FOREIGN PATENT DOCUMENTS

| | | | |
|---|---|---|---|
| JP | 2003231828 A | 8/2003 | |
| JP | 5176068 B2 * | 4/2013 | ............. B32B 15/08 |
| JP | 2017035843 A | 2/2017 | |
| JP | 2017082200 A | 5/2017 | |
| WO | 2009119467 A1 | 10/2009 | |
| WO | 2013141255 A1 | 9/2013 | |
| WO | 2016132929 A1 | 8/2016 | |
| WO | 2018061736 A1 | 4/2018 | |

OTHER PUBLICATIONS

Translation of JP5176068B2. (Year: 2013).*
Translation of JP2017-082200A. (Year: 2017).*
International Search Report issued in corresponding International Application No. PCT/JP2019/029986, dated Oct. 21, 2019 (2 pages).
International Preliminary Report on Patentability issued in corresponding International Application No. PCT/JP2019/029986, dated Feb. 2, 2021 (10 pages).

* cited by examiner

*Primary Examiner* — Catherine A. Simone
(74) *Attorney, Agent, or Firm* — Osha Bergman Watanabe & Burton LLP

(57) ABSTRACT

A metal-clad laminate and techniques using the metal-clad laminate are provided where the metal-clad laminate has excellent adhesiveness between a substrate and metal foil in addition to good dielectric characteristics and heat resistance. The metal-clad laminate includes an insulating layer in contact with metal foil where the insulating layer further includes a resin composition and a fibrous base material. The resin composition contains a specific resin (A) and specific core-shell polymer particles (B), and a surface of the metal foil has a ten-point average roughness (Rz) of not more than 2.0 μm.

12 Claims, No Drawings

METAL-CLAD LAMINATE, PRINTED CIRCUIT BOARD, AND METHOD OF MANUFACTURING SAME

TECHNICAL FIELD

One or more embodiments of the present invention relate to a metal-clad laminate, a printed wiring board including the metal-clad laminate, and a method of producing the metal-clad laminate.

BACKGROUND

A general printed wiring board for use in an electronic device contains an epoxy resin in its substrate material (for example, Patent Literature 1). In recent years, electrical appliances have been increasing in signal capacity, and therefore semiconductor substrates and the like are required to have dielectric characteristics which are necessary for high-speed communication, such as low dielectric constant and low dielectric dissipation factor. However, a substrate using an epoxy resin is insufficient in such dielectric characteristics.

Polyphenylene ethers (PPE) are known to be excellent in dielectric characteristics such as dielectric constant and dielectric dissipation factor and be excellent in dielectric characteristics even in high frequency band (high frequency range) of from MHz band to GHz band. Therefore, in recent years, there has been consideration to use a PPE as a substrate material for formation of a substrate for a printed wiring board for use in an electronic device operated at high frequency band.

For example, Patent Literature 2 discloses a metal-clad laminate produced from a resin composition which comprises (A) a polyphenylene ether in which a hydroxyl group present at a terminal of the main chain has been modified with an ethylenically unsaturated compound, (B) triallyl isocyanurate and/or triallyl cyanurate, and (C) an organic peroxide containing no benzene ring, the component (C) being contained in an amount of 0.1-7 mass % when the sum of the components (A), (B), and (C), (A)+(B)+(C), is taken as 100 mass %.

PATENT LITERATURE

[Patent Literature 1]
Japanese Patent Application Publication, Tokukai, No. 2017-035843
[Patent Literature 2]
PCT International Publication No. WO2016/132929

The foregoing printed wiring board using a PPE is excellent in dielectric characteristics; however, there is room for an improvement in terms of adhesiveness between a substrate and metal foil.

SUMMARY

One or more embodiments of the present invention are to provide a metal-clad laminate that is excellent in adhesiveness between a substrate and metal foil and that also has good dielectric characteristics and heat resistance, a printed wiring board including the metal-clad laminate, and a method of producing the metal-clad laminate.

As a result of diligent research to attain the above, the inventors of one or more embodiments of the present invention found that, when a metal-clad laminate includes as a substrate an insulating layer that contains, as a substrate material, a resin composition that contains (i) a resin whose dielectric dissipation factor (Df) is within a specific range and (ii) core-shell polymer particles having a specific volume-average particle size, such a metal-clad laminate is excellent in adhesiveness between the substrate and metal foil even in a case where the surface roughness of the metal foil is not large. On the basis of this finding, the inventors accomplished one or more embodiments of the present invention.

Specifically, a metal-clad laminate in accordance with one or more embodiments of the present invention is a metal-clad laminate including: an insulating layer including a resin composition and a fibrous base material; and metal foil which is in contact with the insulating layer, in which: the resin composition contains a resin (A) having a dielectric dissipation factor (Df) of not more than 0.0100 at 10 GHz, and core-shell polymer particles (B) having a volume-average particle size of 10 nm to 400 nm; and a surface of the metal foil has a ten-point average roughness (Rz) of not more than 2.0 μm.

A metal-clad laminate in accordance with one or more embodiments of the present invention is a metal-clad laminate including: an insulating layer including a resin composition and a fibrous base material; and metal foil which is in contact with the insulating layer, in which: the insulating layer has a dielectric dissipation factor (Df) of not more than 0.0100 at 10 GHz; a surface of the metal foil has a ten-point average roughness (Rz) of not more than 2.0 μm; and the metal-clad laminate has a 90-degree metal foil peel strength of not less than 0.43 N/mm and an interlaminar fracture toughness ($G_1c$) of not less than 0.26 kJ/m$^2$, the 90-degree metal foil peel strength being measured in accordance with JIS C6481, the interlaminar fracture toughness ($G_1c$) being measured in accordance with ISO15024.

A method of producing a metal-clad laminate in accordance with one or more embodiments of the present invention is a method including the steps of: preparing a masterbatch which contains (i) a solvent that contains methyl ethyl ketone and (ii) core-shell polymer particles (B) which have a volume-average particle size of 10 nm to 400 nm and which are dispersed in the solvent; preparing a resin varnish by dissolving and mixing the masterbatch and a resin (A) in a solvent that contains methyl ethyl ketone or by dispersing the masterbatch and a resin (A) in a solvent that contains methyl ethyl ketone; preparing a prepreg by impregnating glass cloth with the resin varnish; and laminating metal foil and the prepreg, in which a surface of the metal foil which surface is in contact with the prepreg has a ten-point average roughness (Rz) of not more than 2.0 μm.

One or more embodiments of the present invention make it possible to provide a metal-clad laminate that is excellent in adhesiveness between a substrate and metal foil and that also has good dielectric characteristics and heat resistance.

DETAILED DESCRIPTION OF THE EMBODIMENTS

The following description will discuss embodiments of the present invention. The present disclosure is not, however, limited to these embodiments. One or more embodiments of the present invention are not limited to the configurations described below, but may be altered in various ways within the scope of the claims. One or more embodiments of the present invention also encompass, in its technical scope, any embodiment or example derived by combining technical means disclosed in differing embodiments and Examples. Further, it is possible to form a new technical feature by combining the technical means disclosed in various embodiments. All academic and patent documents cited in the present specification are incorporated herein by reference. Any numerical range expressed as "A to B" in the present specification means "not less than A and not more than B (i.e., a range from A to B which includes both A and B)" unless otherwise stated.

1. Technical Idea of One or More Embodiments of the Present Invention

In order to achieve dielectric characteristics required for a metal-clad laminate, study has been conducted on a method using, as a substrate material for the metal-clad laminate, a resin having low dielectric dissipation factor such as a polyphenylene ether (Patent Literature 2). The inventors of one or more embodiments of the present invention novelly found that the technique disclosed in Patent Literature 2 has the following technical issue. Specifically, a substrate produced using a resin having low dielectric dissipation factor is inferior in adhesiveness between itself and metal foil, compared to a substrate produced using a resin having high dielectric dissipation factor such as epoxy resin. The technique disclosed in Patent Literature 2 therefore has room for an improvement in terms of adhesiveness between the substrate and the metal foil. Furthermore, Patent Literature 2 discloses that a resin composition contains a butadiene-styrene copolymer; in this regard, in a case where such a liquid resin is used, a phase separation structure resulting when the liquid resin is mixed with a polyphenylene ether and cured varies in a complicated manner depending on, for example, the mixing ratio between the resins and the conditions in which the mixture is cured. Therefore, the resulting metal-clad laminate is unstable in physical properties such as being inferior in adhesiveness between the substrate and metal foil and having different dielectric characteristics in different areas.

The adhesiveness between the substrate and the metal foil can be increased by increasing the surface roughness (Rz) of the surface of the metal foil which surface makes contact with the substrate. However, it is known that an increase in surface roughness (Rz) of metal foil results in an increase in transmission loss of the resulting metal-clad laminate. Therefore, it is desired that the Rz of the surface of the metal foil be as small as possible. Specifically, it is desired that the ten-point average roughness (Rz) of the surface be not more than 2 μm. According to conventional techniques, in a case where metal foil having a surface roughness of not more than 2 μm is used, it is difficult to achieve sufficient adhesiveness between the substrate and metal foil. Therefore, in order to increase the adhesiveness between the substrate and metal foil, it is necessary to improve the substrate, in particular, to improve a resin composition included in the substrate.

As a result of diligent research to solve the above issue, the inventors of one or more embodiments of the present invention for the first time found the following: surprisingly, with use of a resin composition containing (i) a resin whose dielectric dissipation factor (Df) is within a specific range and (ii) core-shell polymer particles having a specific volume-average particle size, it is possible to obtain a substrate (insulating layer in accordance with one or more embodiments of the present invention) that is excellent in adhesiveness between the substrate and metal foil. Further research revealed that the particle size of the core-shell polymer particles contained in the resin composition may be within a specific range. It is inferred that this is because a sufficient amount of the core-shell polymer particles, together with the resin in the resin composition, need to enter fine recesses in the surface of the metal foil. In this way, the inventors accomplished one or more embodiments of the present invention.

On the contrary, a silicone-based polymer used in the foregoing Patent Literature 2 has an average particle size of about 5 μm, which is large. It is therefore inferred that the effect of improving adhesiveness with copper foil having low roughness, which effect is brought about by the silicone-based polymer, is small.

2. Metal-Clad Laminate

A metal-clad laminate in accordance with one or more embodiments of the present invention is a metal-clad laminate including: an insulating layer including a resin composition and a fibrous base material; and metal foil which is in contact with the insulating layer. The resin composition contains: a resin (A) having a dielectric dissipation factor (Df) of not more than 0.0100 at 10 GHz; and core-shell polymer particles (B) having a volume-average particle size of 10 nm to 400 nm. A surface of the metal foil has a ten-point average roughness (Rz) of not more than 2.0 μm.

The metal-clad laminate in accordance with one or more embodiments of the present invention has the above-stated configuration, and thus is excellent dielectric characteristics and heat resistance and also excellent in adhesiveness between a substrate and metal foil. The term "substrate" refers to an insulating layer in the present disclosure. The metal-clad laminate has better dielectric characteristics when the dielectric dissipation factor of the substrate (insulating layer) is lower and/or the ten-point average roughness (Rz) of the surface of the metal foil is smaller.

In the present specification, a "metal-clad laminate" in accordance with the present disclosure may be referred to as "present metal-clad laminate" for short. That is, the term "present metal-clad laminate" means a metal-clad laminate of the present disclosure.

(2-1. Insulating Layer)

(2-1-1. Resin Composition)

The insulating layer includes a resin composition and a fibrous base material. The following description will discuss components that can be contained in the resin composition included in the insulating layer.

(Resin (A))

The resin (A) is not particularly limited, provided that the resin (A) has a dielectric dissipation factor (Df) of not more than 0.0100 at 10 GHz. Examples of the resin (A) include: benzoxazine; cyanate resin; polyimide (PI); bismaleimide (BMI); polyfunctional styrene compounds such as divinylbenzene; silicon resin; polyester resin; liquid crystal polymer (LCP); hydrocarbon resin; polyphenylene ether; modified polyphenylene ether (modified polyphenylene oxide) (PPO); cycloolefin copolymer (COC); poly(p-phenylene sulfide) (PPS); poly(ether sulfone) (PES), poly(ether ketone) (PEEK); and polytetrafluoroethylene (PTFE).

The resin (A) may be a cyanate resin, BMI, a polyfunctional styrene compound, a hydrocarbon resin, a polyphenylene ether, and/or a modified polyphenylene ether, a polyphenylene ether and/or a modified polyphenylene ether, or a modified polyphenylene ether, because such resins are thermosetting resins and have particularly low dielectric dissipation factor. It is known that a polyphenylene ether has a dielectric dissipation factor of about 0.002.

The resin (A) can be only one type selected from the group consisting of the above-listed resins and copolymers and the like. Alternatively, the resin (A) can be a combination of two or more types selected from the group. Examples of the resin (A) include (a) a mixture of a polyphenylene ether and a hydrocarbon resin, (b) a mixture of a cyanate resin and a bismaleimide, and the like.

A hydrocarbon resin is preferred for its high weight-loss temperature. A hydrocarbon resin is preferred because the hydrocarbon resin does not easily decompose at high temperature. A hydrocarbon resin can also be said to be a resin having high thermal stability.

Even in a case where a large amount of silica is mixed into a mixture of a cyanate resin and a bismaleimide, the resulting resin composition has low viscosity and is easy to handle. Since silica has low dielectric dissipation factor, an insulating layer that includes a resin composition containing a large amount of silica is advantageous in that the insulating layer has low dielectric dissipation factor. That is, in a case where a mixture of a cyanate resin and a bismaleimide is used as the resin (A) and where the resin composition further contains a large amount of silica, the resulting insulating layer has low dielectric dissipation factor.

It is preferable that the resin (A) in the present metal-clad laminate includes a polyphenylene ether that contains a crosslinkable functional group. It is more preferable that the resin (A) is a polyphenylene ether that contains a crosslinkable functional group. According to such a configuration, the resulting metal-clad laminate has even better dielectric characteristics.

Examples of the polyphenylene ether that contains a crosslinkable functional group include: (a) a poly(arylene ether) copolymer composed of (i) a bifunctional phenol(s) and/or a trifunctional phenol(s) and (ii) 2,6-dimethylphenol; (b) a polyphenylene ether containing as a main component a polyphenylene ether such as poly(2,6-dimethyl-1,4-phenylene oxide); and the like. The polyphenylene ether that contains a crosslinkable functional group is, more specifically, a polyphenylene ether which has a structure shown in the following Formula 1, for example.

According to such a configuration, the resulting metal-clad laminate has even better dielectric characteristics.

The substituent that contains an unsaturated carbon-carbon double bond is not particularly limited, and is, for example, acrylate group, methacrylate group, or a substituent represented by the following Formula 2.

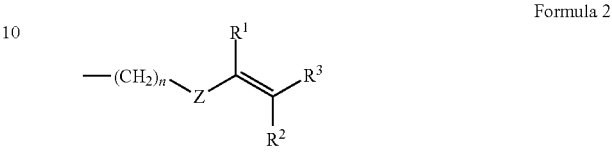

Formula 2

In Formula 2, n represents an integer of 0 to 10. In Formula 2, (a) Z represents an arylene group in a case where n is an integer of 1 to 10, and (b) Z represents an arylene group or a carbonyl group in a case where n is 0. In Formula 2, $R^1$ to $R^3$ independently represent a hydrogen atom or an alkyl group.

Note that, in Formula 2 above, a case where n is 0 means that Z is directly bonded to a terminal of the polyphenylene ether.

Examples of the arylene group and the carbonyl group each represented by Z include: (a) monocyclic aromatic groups such as phenylene group; and (b) polycyclic aromatic groups such as naphthalene ring. Note that examples of the arylene group and the carbonyl group also include derivatives of monocyclic aromatic groups and derivatives of polycyclic aromatic groups, in each of which a hydrogen atom bound to an aromatic ring has been substituted by a functional group such as an alkenyl group, an alkynyl group, formyl group, an alkyl carbonyl group, an alkenyl carbonyl group, or an alkynyl carbonyl group.

Specific examples of the functional group in the foregoing Formula 2 include functional groups containing a vinylben-

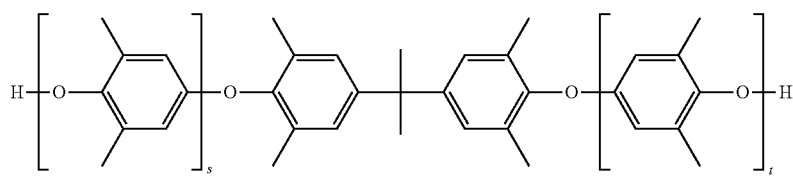

Formula 1

In Formula 1, s and t independently are an integer of 0 or more. For example, the sum of s and t may be 1 to 30. Furthermore, s may be 0 to 20, and t may be 0 to 20. Specifically, it is preferable that s represents 0 to 20, t represents 0 to 20, and the sum of s and t is 1 to 30.

In one or more embodiments of the present invention, it is preferable that the resin (A) is a modified polyphenylene ether which has a terminal modified with a substituent containing an unsaturated carbon-carbon double bond (hereinafter may be referred to as "modified polyphenylene ether" for short). According to such a configuration, the resulting metal-clad laminate has better dielectric characteristics.

In one or more embodiments of the present invention, it is more preferable that: the resin (A) includes a polyphenylene ether that contains a crosslinkable functional group; and that the polyphenylene ether is a modified polyphenylene ether which has a terminal modified with a substituent containing an unsaturated carbon-carbon double bond.

zyl group. Specifically, for example, at least one substituent selected from the following Formulas 3 and 4 or the like substituent can be employed.

Formula 3

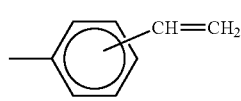

Formula 4

Other specific examples of the substituent that contains an unsaturated carbon-carbon double bond include a (meth) acrylate group represented by the following Formula 5.

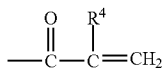
Formula 5

In Formula 5, $R^4$ represents a hydrogen atom or an alkyl group.

The following description discuses a case where the resin (A) is a modified polyphenylene ether. A method of synthesizing a modified polyphenylene ether is not particularly limited, provided that it is possible to synthesize a modified polyphenylene ether which has a terminal modified with a substituent containing an unsaturated carbon-carbon double bond. Specifically, for example, the modified polyphenylene ether can be synthesized by a method using a compound represented by the following Formula 6 or the like method.

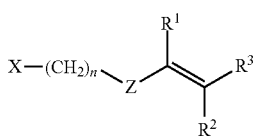
Formula 6

In Formula 6, n, Z, and $R^1$ to $R^3$ are as defined for the foregoing Formula 2. Specifically, n represents an integer of 0 to 10. (a) Z represents an arylene group in a case where n is an integer of 1 to 10, and (b) Z represents an arylene group or a carbonyl group in a case where n is 0. $R^1$ to $R^3$ independently represent a hydrogen atom or an alkyl group. In Formula 6, X represents a halogen atom, specific examples of which include chlorine atom, bromine atom, iodine atom, and fluorine atom. Of these, chlorine atom is preferred as X.

The compound represented by the Formula 6 is not particularly limited, and may be, for example, p-chloromethylstyrene and/or m-chloromethylstyrene.

The compound represented by the above Formula 6 may be only one of those listed above or a combination of two or more of those listed above.

A method of synthesizing a modified polyphenylene ether using a compound of the above Formula 6 is specifically described below. The method involves: dissolving, in a solvent, (a) a polyphenylene ether in which the hydrogen atom of a terminal phenolic hydroxyl group of the polyphenylene ether has been substituted by an alkali metal atom(s) such as sodium and/or potassium and (b) the compound represented by Formula 6; and stirring the resulting mixture. This allows the alkali metal atom-substituted polyphenylene ether and the compound represented by Formula 6 to react with each other (this reaction may be hereinafter referred to as "reaction A") to give a modified polyphenylene ether which has a terminal modified with a substituent containing an unsaturated carbon-carbon double bond.

The reaction A may be carried out in the presence of an alkali metal hydroxide. It is inferred that this allows the reaction A to proceed in a suitable manner.

The alkali metal hydroxide is not particularly limited, provided that the alkali metal hydroxide can serve as a dehalogenation agent. The alkali metal hydroxide can be, for example, sodium hydroxide or the like. The alkali metal hydroxide is used usually in the form of an aqueous solution. For example, sodium hydroxide is used in the form of an aqueous sodium hydroxide solution.

The conditions in which the reaction A is carried out, such as reaction time and reaction temperature, may vary depending on the type of compound represented by Formula 6, etc. The conditions in which the reaction A is carried out are not particularly limited, provided that the reaction A proceeds in a suitable manner. Specifically, the reaction temperature (temperature at which the reaction A is carried out) may be room temperature to 100° C., or 30° C. to 100° C. The reaction time (time for which the reaction A is carried out) may be 0.5 hours to 20 hours, or 0.5 hours to 10 hours.

A solvent for use in the reaction A is not particularly limited, provided that the solvent can dissolve the polyphenylene ether and the compound represented by Formula 6 and does not hinder the reaction A. A specific example of the solvent is toluene or the like.

The reaction A may be carried out in the presence of a phase-transfer catalyst in addition to the alkali metal hydroxide. Specifically, the reaction A may be carried out in the presence of an alkali metal hydroxide and a phase-transfer catalyst. It is inferred that this allows the reaction A to proceed in a more suitable manner.

The phase-transfer catalyst is not particularly limited, and can be, for example, a quaternary ammonium salt such as tetra-n-butylammonium bromide.

The resin composition in accordance with one or more embodiments of the present invention may contain, as the resin (A), a modified polyphenylene ether obtained in the above-stated manner. This makes it possible to provide a metal-clad laminate that has very low dielectric characteristics and excellent heat resistance.

The resin (A) may further contain a crosslinking agent that contains an unsaturated carbon-carbon double bond. In other words, it is preferable that the resin (A) has been crosslinked by a crosslinking agent that contains an unsaturated carbon-carbon double bond. According to such a configuration, the resin (A) has a firmly crosslinked structure, and the resulting metal-clad laminate will have excellent heat resistance.

The crosslinking agent may be a compound which (a) contains two or more unsaturated carbon-carbon double bonds per molecule and (b) functions as a crosslinking agent for crosslinking molecules of a resin and a copolymer, molecules of a resin and a resin, and molecules of a copolymer and a copolymer contained in the resin (A). Specific examples of such a compound include a compound represented by the following Formula 7.

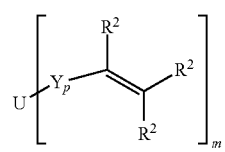
Formula 7

In Formula 7, $R^1$ to $R^3$ are as defined for Formula 2, and independently represent a hydrogen atom or an alkyl group. In Formula 7, m represents an integer of 1 to 3, p represents 0 or 1, and U represents an arylene group, a tricyclodecane skeleton, or an isocyanurate group. Y represents

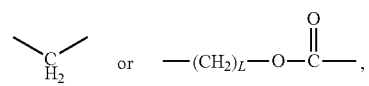

where L represents an integer of 1 or more.

More specifically, the crosslinking agent can be, for example, (a) a trialkenyl isocyanurate compound such as triallyl isocyanurate (TRIC), (b) a polyfunctional methacrylate compound containing two or more methacryl groups per molecule, (c) a polyfunctional acrylate compound containing two or more acryloyl groups per molecule, (d) a vinylbenzyl compound containing a vinylbenzyl group per molecule, such as styrene or divinylbenzene, and/or the like. It is inferred that, in a case where such a compound(s) is used, the compound(s) undergoes a curing reaction with the resin(s) and/or the copolymer(s) and thereby crosslinks are formed in a more suitable manner. This makes it possible to further increase the heat resistance of the metal-clad laminate.

The crosslinking agent may be only one of the compounds listed above or a combination of two or more of the compounds. A compound containing two or more unsaturated carbon-carbon double bonds per molecule and a compound containing one unsaturated carbon-carbon double bond per molecule may be used in combination. The compound containing one unsaturated carbon-carbon double bond per molecule can be, specifically, a compound containing one vinyl group per molecule (monovinyl compound) or the like.

In a case where the resin (A) contains a crosslinking agent, the amount of the resin(s) and/or the copolymer(s) (i.e., components other than the crosslinking agent) in the resin (A) may be 50 parts by weight to 99 parts by weight, 65 parts by weight to 95 parts by weight, or 70 parts by weight to 90 parts by weight, with respect to the combined amount (100 parts by weight) of (a) the resin(s) and/or the copolymer(s) and (b) the crosslinking agent in the resin (A). The amount of the crosslinking agent contained in the resin (A) may be 1 part by weight to 50 parts by weight, 5 parts by weight to 35 parts by weight, or 10 parts by weight to 30 parts by weight, with respect to the combined amount (100 parts by weight) of (a) the resin(s) and/or the copolymer(s) and (b) the crosslinking agent in the resin (A). That is, the weight ratio, "resin(s) and/or the copolymer(s):crosslinking agent", between (a) the resin(s) and/or the copolymer(s) and (b) the crosslinking agent, contained in the resin (A), may be 99:1 to 50:50, 95:5 to 65:35, or 90:10 to 70:30. In a case where (a) the resin(s) and/or the copolymer(s) and (b) the crosslinking agent are contained in amounts that satisfy the weight ratio stated above, the resulting metal-clad laminate will have excellent heat resistance and have excellent adhesiveness between the insulating layer and metal foil. It is inferred that this is because the curing reaction between (a) the resin(s) and/or the copolymer(s) and (b) the crosslinking agent proceeds in a suitable manner.

Note that, as the foregoing polyphenylene ether, any of the polyphenylene ethers disclosed in Japanese Patent Application Publication Tokukai No. 2017-128718 and the like can be suitably used, for example.

(Core-Shell Polymer Particles (B))

The core-shell polymer particles (B) are particles having a structure including: a core layer which is present inside the particle and which is composed of a crosslinked polymer; and at least one shell layer which covers part or all of the core layer. The weight ratio between the core layer and the shell layer, in terms of "core layer/shell layer" (in terms of the weight ratio between monomers forming the polymer of the core layer and monomers forming the polymer of the shell layer), may be in the range of 50/50 to 99/1, 60/40 to 95/5, or 70/30 to 90/10, in order to (a) reduce the viscosity of the resin composition and allow the resin composition to be easy to handle, (b) stably disperse the core-shell polymer particles (B) in the resin composition, and (c) increase the toughening effect provided by the core-shell polymer particles (B). The "toughening effect" is the effect of improving the interlaminar fracture toughness ($G_1c$) of the resulting metal-clad laminate. Since the resin composition contains the core-shell polymer particles (B), the present metal-clad laminate not only has excellent adhesiveness between the insulating layer and metal foil but also has excellent interlaminar fracture toughness ($G_1c$).

The core layer may be composed of a crosslinked polymer and substantially does not dissolve in a solvent. The gel content of the core layer may be therefore not less than 60 weight %, not less than 80 weight %, not less than 90 weight %, or not less than 95 weight %.

It is preferable that the core layer of the core-shell polymer particles (B) is composed of a rubber elastic body obtained by polymerizing (i) not less than 50 weight % and not more than 100 weight % of at least one type of monomer selected from the group consisting of diene-based monomers and (meth)acrylic ester-based monomers and (ii) not less than 0% and not more than 50 weight % of a copolymerizable vinyl monomer which is different from the at least one type of monomer. The copolymerizable vinyl monomer may be at least one type of monomer selected from the group consisting of aromatic vinyl compounds, vinyl cyanide compounds, unsaturated carboxylic acid derivatives, (meth)acrylamide derivatives, and maleimide derivatives. According to such a configuration, the resulting metal-clad laminate will have excellent adhesiveness between the insulating layer and metal foil.

It is more preferable that the core layer of the core-shell polymer particles (B) is composed of a rubber elastic body obtained by polymerizing (i) not less than 60 weight % and not more than 100 weight % of at least one type of monomer selected from the group consisting of diene-based monomers and (meth)acrylic ester-based monomers and (ii) not less than 0% and not more than 40 weight % of a copolymerizable vinyl monomer which is different from the at least one type of monomer. It is even more preferable that the core layer of the core-shell polymer particles (B) is composed of a rubber elastic body obtained by polymerizing (i) not less than 70 weight % and not more than 100 weight % of at least one type of monomer selected from the group consisting of diene-based monomers and (meth)acrylic ester-based monomers and (ii) not less than 0% and not more than 30 weight % of a copolymerizable vinyl monomer which is different from the at least one type of monomer.

The "monomer selected from the group consisting of diene-based monomers and (meth)acrylic ester-based monomers" is hereinafter referred to as "monomer (a)". The "copolymerizable vinyl monomer" means a vinyl monomer which is copolymerizable with the monomer (a). In the present specification, the term "(meth)acrylic" means "acrylic and/or methacrylic".

Examples of the diene-based monomers include butadiene, isoprene, chloroprene, and the like. Butadiene is particularly preferred. Examples of the (meth)acrylic ester-based monomers include butyl acrylate, 2-ethyl hexyl acrylate, lauryl methacrylate, and the like. Butyl acrylate and 2-ethylhexyl acrylate are particularly preferred. Such monomers may be used alone or in combinations of two or more.

The amount of the at least one monomer (a), with respect to the total weight (100 weight %) of the core layer, may be not less than 50 weight %, not less than 60 weight %, or not less than 70 weight %. In a case where the amount of the at least one monomer (a) is not less than 50 weight %, a sufficient toughening effect is provided by the core-shell polymer particles (B).

The core layer may be a homopolymer obtained by polymerizing one monomer (a), or may be a copolymer of two or more monomers (a). The core layer may be a copolymer of (i) at least one monomer (a) and (ii) a vinyl monomer which is copolymerizable with the monomer (a). The copolymerizable vinyl monomer is, for example, at least one type of monomer selected from the group consisting of aromatic vinyl compounds, vinyl cyanide compounds, unsaturated carboxylic acid derivatives, (meth)acrylamide derivatives, and maleimide derivatives. Examples of the aromatic vinyl compounds include styrene, α-methylstyrene, vinylnaphthalene, and the like. Examples of the vinyl cyanide compounds include (meth)acrylonitrile, substituted acrylonitrile, and the like. Examples of the unsaturated carboxylic acid derivatives include (meth)acrylic acid, itaconic acid, crotonic acid, maleic anhydride, and the like. Examples of the (meth)acrylamide derivatives include (meth)acrylamides (including N-substituted derivatives) and the like. Examples of the maleimide derivatives include maleic acid imides (including N-substituted derivatives) and the like. Such monomers may be used alone or in combinations of two or more. The amount of the copolymerizable vinyl monomer(s), with respect to the total weight (100 weight %) of the core layer, may be not more than 50 weight %, or not more than 40 weight %. The core layer may particularly be a styrene-butadiene rubber, because the styrene-butadiene rubber makes it possible to reduce the dielectric dissipation factor of the core-shell polymer particles (B) and to obtain a metal-clad laminate that has excellent electrical characteristics.

In one or more embodiments of the present invention, the core layer has a single-layer structure in many cases; however, the core layer may have a multilayer structure. In cases where the core layer has a multilayer structure, each layer may have a differing polymer composition.

For the purpose of adjusting the degree of crosslinking or for the purpose of reducing the swelling of the core layer with the resin (A) and/or a solvent by covering the core layer, the core layer can be produced from components containing a crosslinking monomer. Examples of the crosslinking monomer include divinylbenzene, butanediol di(meth)acrylate, triallyl (iso)cyanurate, allyl (meth)acrylate, diallyl itaconate, diallyl phthalate, and the like. The amount of the crosslinking monomer in 100 weight % of the core-shell polymer particles (B) may be 0.2 weight % to 7 weight %, 0.5 weight % to 5 weight %, or 1 weight % to 3 weight %. In a case where the amount of the crosslinking monomer is not more than 7 weight %, the core-shell polymer particles (B) provide sufficient toughening effect. In particular, covering the core layer with the crosslinking monomer and forming an intermediate layer is effective in reducing swelling with the resin (A) and/or a solvent and is effective in reducing an increase in viscosity of resin varnish and melt viscosity of the resin composition. The above covering and forming is also effective in reducing fusion between the core-shell polymer particles (B), and is therefore suitable in reducing the adhesion of the core-shell polymer particles (B) to the wall of a stirring vessel during production of a resin composition. A compound for use in formation of the intermediate layer is not particularly limited, and may be a trialkenyl isocyanurate compound such as triallyl isocyanurate (TRIC).

For the purpose of adjusting the molecular weight of the polymer constituting the core layer and/or the degree of crosslinking of the polymer constituting the core layer, a chain transfer agent can be used in formation of the core layer. Examples of the chain transfer agent which can be used include C5 to C20 alkyl mercaptans. The amount of the chain transfer agent in 100 weight % of the core layer may be not more than 5 weight %, or not more than 3 weight %. In a case where the amount of the chain transfer agent is not more than 5 weight %, not many uncrosslinked components will remain in the core layer, and the resulting resin composition will have appropriate viscosity and be easy to handle.

The core layer may contain a crosslinked aromatic vinyl. Examples of the crosslinked aromatic vinyl include copolymers of an aromatic vinyl compound and the foregoing crosslinking monomer. Examples of the aromatic vinyl compound which can be used in the crosslinked aromatic vinyl include: unsubstituted vinyl aromatic compounds such as styrene and 2-vinyl naphthalene; substituted vinyl aromatic compounds such as α-methyl styrene; ring-alkylated vinyl aromatic compounds such as 3-methylstyrene, 4-methylstyrene, 2,4-dimethylstyrene, 2,5-dimethylstyrene, 3,5-dimethylstyrene, and 2,4,6-trimethylstyrene; ring-alkoxylated vinyl aromatic compounds such as 4-methoxystyrene and 4-ethoxystyrene; ring-halogenated vinyl aromatic compounds such as 2-chlorostyrene and 3-chlorostyrene; ring-ester-substituted vinyl aromatic compounds such as 4-acetoxystyrene; and ring-hydroxylated vinyl aromatic compounds such as 4-hydroxystyrene. A core layer containing a crosslinked aromatic vinyl is preferred because the resulting metal-clad laminate will have increased toughness instead of decreasing in rigidity.

The core layer may include a polysiloxane rubber-based elastic body. The polysiloxane rubber-based elastic body which can be used is, for example, a polysiloxane rubber composed of alkyl or aryl disubstituted silyloxy units, such as dimethylsilyloxy, methylphenylsilyloxy, or diphenylsilyloxy. The polysiloxane rubber-based elastic body may be one that has a crosslinked structure introduced therein as necessary by a method that involves using a polyfunctional alkoxysilane compound together with a polysiloxane rubber during polymerization, a method that involves subjecting a silane compound containing a reactive vinyl group to a radial reaction, or the like method.

The shell layer of the core-shell polymer particles (B) is a layer formed by graft polymerizing, to a crosslinked polymer which is the core layer, a graft copolymerizable monomer(s) (monomer for forming shell).

The term "shell layer" refers to a layer at least part of which is present at the outermost part of the core-shell polymer particle. In other words, the shell layer does not have to be entirely present at the outermost part of the core-shell polymer particle. The shell layer may be partially present inside the core layer.

A polymer of the shell layer is not limited to a particular type. The polymer of the shell layer may be a (co)polymer obtained by polymerizing at least one type selected from (meth)acrylic ester-based monomers, aromatic vinyl-based monomers, vinyl cyanide-based monomers, unsaturated carboxylic acid derivatives, (meth)acrylamide derivatives, and maleimide derivatives, because such a (co)polymer has high affinity with the resin (A).

Particularly for the purpose of allowing the shell layer to be chemically reactive with the resin (A), the polymer of the shell layer may be a copolymer obtained by copolymerizing (a) at least one type selected from the foregoing (meth)acrylic ester-based monomers, aromatic vinyl-based monomers, vinyl cyanide-based monomers, unsaturated carboxylic acid derivatives, (meth)acrylamide derivatives, and maleimide derivatives and (b) at least one type of vinyl monomer containing a functional group(s) selected from the group consisting of epoxy group, carboxyl group, hydroxyl group, amino group, and carbon-carbon double bond. Such functional groups may be reactive with the resin (A), a curing agent, a curing catalyst, and/or the like. This makes it possible to effectively reduce the likelihood that the core-shell polymer particles (B) will agglutinate again and be poorly dispersed under the conditions in which curing is carried out.

Examples of the (meth)acrylic ester-based monomer include alkyl (meth)acrylate esters such as methyl (meth) acrylate, ethyl (meth)acrylate, butyl (meth)acrylate, and 2-ethylhexyl (meth)acrylate. Methyl methacrylate is also called methyl methacrylate. Examples of the aromatic vinyl-based monomers include: styrene; alkyl-substituted styrenes such as α-methylstyrene; and halogen-substituted styrenes such as bromostyrene and chlorostyrene. Examples of the vinyl cyanide-based monomers include (meth)acrylonitrile, substituted (meth)acrylonitrile, and the like. Examples of the unsaturated carboxylic acid derivatives include (meth) acrylic acid, itaconic acid, crotonic acid, maleic anhydride, and the like. Examples of the (meth)acrylamide derivatives include (meth)acrylamides (including N-substituted versions) and the like. Examples of the maleimide derivatives include maleic acid imides (including N-substituted versions) and the like. Examples of the monomers containing a reactive functional group(s) include: (meth)acrylic esters having a reactive side chain, such as 2-hydroxyethyl (meth) acrylate, 2-aminoethyl meth(acrylate), and glycidyl (meth) acrylate; vinyl ethers containing a reactive functional group, such as glycidylvinyl ether and allyl vinyl ether. Glycidyl methacrylate is also called glycidyl methacrylate.

The shell layer of the core-shell polymer particles (B) may contain epoxy group, because the adhesiveness between the insulating layer and metal foil improves.

The inventors of one or more embodiments of the present invention for the first time found that, in a case where the shell layer contains epoxy group, the metal-clad laminate can be further increased in interlaminar fracture toughness ($G_1c$) even if the resin (A) is not an epoxy curing resin. Although the reasons therefor are unclear, the following reasons are surmised, for example. The core-shell polymer particles better interact with a fibrous base material and/or other inorganic filler. With this, the core-shell polymer particles greatly contribute to improving the adhesiveness at the interface between such materials and the resin (A) and, as a result, greatly contribute to improving the interlaminar fracture toughness of the metal-clad laminate. Such an improvement in interlaminar fracture toughness appears to be a cause of an improvement in adhesiveness between the insulating layer and metal foil.

In a case where the resin composition contains epoxy group, the adhesiveness between the insulating layer and metal foil increases in proportion to the amount of the epoxy group contained; however, the insulating layer decreases in dielectric characteristics in proportion to the amount of the epoxy group contained. Thus, the resin composition may contain epoxy group in terms of adhesiveness between the insulating layer and metal foil, but the resin composition may contain substantially no epoxy group in terms of dielectric characteristics. The amount of epoxy group contained in the resin composition may set in consideration of the balance between (i) the adhesiveness between the insulating layer and metal foil and (ii) the dielectric characteristics of the insulating layer. For example, the resin composition may contain a small amount of epoxy group. Specifically, it is preferable that the shell layer of the core-shell polymer particles (B) contains epoxy group and thereby the resin composition contains a small amount of epoxy group.

In one or more embodiments of the present invention, the shell layer of the core-shell polymer particles (B) is composed of a polymer of monomers for forming the shell layer (100 mass % in total) which may be made up of: 0 mass % to 80 mass % (10 mass % to 70 mass %, or 10 mass % to 60 mass %) of an aromatic vinyl-based monomer (particularly, styrene); 0 mass % to 50 mass % (1 mass % to 30 mass %, 5 mass % to 25 mass %, or 10 mass % to 25 mass %) of a vinyl cyanide-based monomer (particularly, acrylonitrile); 0 mass % to 50 mass % (or 5 mass % to 45 mass %) of a (meth)acrylic ester-based monomer (particularly, methyl methacrylate); and 0 mass % to 50 mass % (5 mass % to 30 mass %, 10 mass % to 25 mass %, or 15 mass % to 20 mass %) of a monomer containing reactive functional group (particularly, glycidyl methacrylate).

It is preferable that styrene unit constitutes not less than 30 weight %, not less than 40 weight %, or not less than 50 weight % out of 100 weight % of the core-shell polymer particles (B). Such a configuration makes it possible to reduce the dielectric dissipation factor of the core-shell polymer particles (B) and possible to obtain a metal-clad laminate having excellent electrical characteristics.

In one or more embodiments of the present invention, the shell layer may have a single-layer structure or a multilayer structure. In cases where the shell layer has a multilayer structure, each layer may have a differing polymer composition.

The core-shell polymer particles (B) in the resin composition may have a volume-average particle size of 10 nm to 400 nm, 30 nm to 350 nm, 50 nm to 300 nm, 80 nm to 250 nm, or 100 nm to 200 nm. Such a configuration makes it possible to allow the core-shell polymer particles (B) to sufficiently show its toughening effect, and possible to provide a metal-clad laminate that is excellent in adhesiveness between an insulating layer and metal foil. The volume-average particle size of the core-shell polymer particles (B) in the resin composition can be measured with use of, for example, Microtrac (Microtrac UPA manufactured by Nikkiso Co., Ltd.). The volume-average particle size of the core-shell polymer particles (B) in the metal-clad laminate can also be measured by cutting the metal-clad laminate, obtaining an image of the cut section, and then using the obtained image data (image) to measure the volume-average particle size.

The core-shell polymer particles (B) may be dispersed in the form of primary particles in the resin composition. The dispersion of the core-shell polymer particles (B) in the form of primary particles can be confirmed by confirming that, for example, the value of the volume-average particle size (Mv)/number-average particle size (Mn) is not more than 3. The value of the volume-average particle size (Mv)/number-average particle size (Mn) may be not more than 2.5, not more than 2, or not more than 1.5. In a case where the value of the volume-average particle size (Mv)/number-average particle size (Mn) is more than 3, such a value indicates that the core-shell polymer particles (B) are forming an agglutinate (secondary particle). Note that the number-average particle size (Mn) can also be measured by the method as described earlier, similarly to the volume-average particle size. The value of the volume-average particle size (Mv)/number-average particle size (Mn) can be determined by dividing the volume-average particle size (Mv) by the number-average particle size (Mn).

The primary particle size of the core-shell polymer particles (B) may be 10 nm to 400 nm, 30 nm to 350 nm, 50 nm to 300 nm, 80 nm to 250 nm, or 100 nm to 200 nm, because the core-shell polymer particles (B) having such a primary particle size can easily keep their dispersed-particle diameter equal to the primary particle size in the resin composition. The value of the volume-average particle size can be used as-is as the average primary particle size, provided that the value of the volume-average particle size (Mv)/number-average particle size (Mn) is not more than 3.

A method of producing the core-shell polymer particles (B) is not particularly limited, and a well-known method such as emulsion polymerization, suspension polymerization, or microsuspension polymerization can be used to produce the core-shell polymer particles (B). Among these methods, a method using multistage emulsion polymerization is particularly preferred. Specific examples of an emulsifying (dispersion) agent for use in emulsion polymerization include alkali metal salts and ammonium salts of the following acids: alkyl sulfonic acids (such as dioctyl sulfosuccinic acid) and aryl sulfonic acids (such as dodecylbenzenesulfonic acid); alkyl ether sulfonic acids and aryl ether sulfonic acids; alkyl sulfates (such as dodecyl sulfate) and aryl sulfates; alkyl ether sulfates and aryl ether sulfates; alkyl-substituted phosphoric acids and aryl-substituted phosphoric acids; alkyl ether-substituted phosphoric acids and aryl ether-substituted phosphoric acids; N-alkyl sarcosine acids (such as dodecyl sarcosine acid) and N-aryl sarcosine acids; alkyl carboxylic acids (such as oleic acid and stearic acid) and aryl carboxylic acids; and alkyl ether carboxylic acids and aryl ether carboxylic acids. Specific examples of an emulsifying (dispersion) agent also include: nonionic emulsifying agents and nonionic dispersion agents such as alkyl-substituted polyethylene glycols and aryl-substituted polyethylene glycols; and dispersion agents such as polyvinyl alcohol, alkyl-substituted celluloses, polyvinylpyrrolidone, and polyacrylic acid derivatives. These emulsifying (dispersion) agents may be used alone or in combination of two or more.

The emulsifying agent may be an anionic emulsifying agent, an anionic emulsifying agent which is an alkali metal salt, or an anionic emulsifying agent which is sodium salt and/or potassium salt, in terms of stability of polymerization.

Such an emulsifying (dispersion) agent may be used in as small an amount as possible while ensuring that there is no negative effect on the dispersion stability during preparation of an aqueous dispersion containing core-shell polymer particles, in terms of the gist of one or more embodiments of the present invention. Alternatively, the emulsifying (dispersion) agent may be extracted and removed during the preparation of the resin composition so that the emulsifying (dispersion) agent only remains in an amount that has no impact on the physical properties of the resin composition required under the circumstances in which the resin composition is used. The emulsifying (dispersion) agent may therefore be soluble in water.

The amount of the core-shell polymer particles (B) contained in the resin composition, with respect to 100 parts by weight of the resin (A), may be 1 part by weight to 30 parts by weight, 2 parts by weight to 20 parts by weight, 3 parts by weight to 15 parts by weight, or 5 parts by weight to 12 parts by weight. With this configuration, the resulting metal-clad laminate will have an advantage in that both the following (a) and (b) can be achieved: (a) excellent adhesiveness between an insulating layer and metal foil; and (b) excellent dielectric characteristics resulting from low dielectric dissipation factor.

The dielectric dissipation factor of the core-shell polymer particles (B) may be not more than 0.1000, not more than 0.0300, not more than 0.0150, or not more than 0.0100. With this configuration, the resulting metal-clad laminate will have low dielectric dissipation factor and excellent dielectric characteristics (electrical characteristics). The dielectric dissipation factor of the core-shell polymer particles (B) can be measured with use of a cavity resonator or the like. A specific method of measurement will be described later in Examples.

(Other Components)

The resin composition may contain: a resin (A) that contains no crosslinking agents; and core-shell polymer particles (B). Alternatively, the resin composition may contain: a resin (A) that contains a crosslinking agent; and core-shell polymer particles (B). The resin composition may further contain some other component(s) in addition to the resin (A) an the core-shell polymer particles (B). Examples of such other components include inorganic filler, flame retardants, and additives.

The resin composition may further contain an inorganic filler (D).

The inorganic filler (D) which can be used in one or more embodiments of the present invention is not particularly limited. Examples of the inorganic filler (D) include: spherical silica; barium sulfate; silicon oxide powder; crushed silica; calcined talc; barium titanate; titanium oxide; clay; alumina; mica; boehmite; zinc borate; zinc stannate; metal oxides other than titanium oxide, calcined talc, alumina, and mica; and metal hydrates other than boehmite. In a case where the resin composition contains the inorganic filler (D), the thermal expansion of the resulting metal-clad laminate can be reduced and dimensional stability can be improved.

It is preferable that silica is used as the inorganic filler (D), because this allows the resulting metal-clad laminate to have excellent heat resistance and excellent dielectric dissipation factor. Silica has low dielectric dissipation factor.

In a case where the resin composition contains the inorganic filler (D), the amount of the inorganic filler (D) contained in the resin composition may be 40 parts by weight to 200 parts by weight, where 100 parts by weight represents the combined amount of the resin (A) and the core-shell polymer particles (B). In a case where the inorganic filler (D) is contained in an amount not more than 200 parts by weight as describe above, this eliminates the likelihood that the ability of resin varnish to be impregnated into the fibrous base material will decrease during preparation of the insulating layer and that the adhesiveness between the insulating layer and metal foil will decrease.

The resin composition may contain the foregoing inorganic filler (D) in addition to the resin (A) and the core-shell polymer particles (B), and may further contain other additive(s). Examples of the other additives include: defoaming agents such as silicone-based defoaming agents and acrylic ester-based defoaming agents; flame retardants; thermal stabilizers; antistatic agents; enhancers; ultraviolet ray absorbing agents; colorants; pigments; lubricants; and dispersion agents such as wetting and dispersing agent.

(2-1-2. Fibrous Base Material)

Specific examples of the fibrous base material include glass cloth, aramid cloth, polyester cloth, nonwoven glass fabric, nonwoven aramid fabric, nonwoven polyester fabric, paper made of pulp, linter paper, and the like. The fibrous base material may be glass cloth, or flattened glass cloth, because a metal-clad laminate obtained using such glass cloth will have excellent mechanical strength. The flattening of glass cloth can be carried out specifically by, for example, compressing yarns into a flat shape by continuously applying an appropriate pressure to the glass cloth with use of a press roll. Note that a fibrous base material having a thickness of, for example, 0.04 mm to 0.3 mm can generally be used.

(2-1-3. Dielectric Dissipation Factor of Insulating Layer)

The insulating layer may have a dielectric dissipation factor, under the condition of 10 GHz, of not more than 0.0100, not more than 0.0080, not more than 0.0060, or not more than 0.0040. The lower limit of the dielectric dissipation factor of the insulating layer is not particularly limited, and is, for example, more than 0.0000. In a case where the insulating layer has a dielectric dissipation factor falling within the above range, the metal-clad laminate will have excellent electrical characteristics. The dielectric dissipation factor of the insulating layer can be measured in a similar manner to the dielectric dissipation factor of the core-shell polymer particles (B). With regard to an insulating layer which constitutes a part of a metal-clad laminate, the dielectric dissipation factor of the insulating layer can be measured by: removing the metal foil from the metal-clad laminate; and then measuring the dielectric dissipation factor of the resulting insulating layer in a similar manner to the dielectric dissipation factor of the core-shell polymer particles (B). A method of removing the metal foil from the metal-clad laminate is not particularly limited, and may be, for example, a method involving dissolving a metal of the metal-clad laminate with use of an etchant or the like method.

(2-2. Metal Foil)

The metal foil of the present metal-clad laminate is not particularly limited, and may be, for example, copper foil, silver foil, gold foil, or the like. Among those listed above, copper foil is preferred in terms of cost and electric conductivity.

The ten-point average roughness (Rz) of the surface of the metal foil may be not more than 2.0 μm, not more than 1.5 μm, or not more than 1.0 μm. With this configuration, the resulting metal-clad laminate will have excellent dielectric characteristics. The ten-point average roughness of the surface of the metal foil can be measured by, for example, a method in accordance with JISB 0601, a method using scanning electron microscopy, or the like method. With regard to metal foil which constitutes a part of a metal-clad laminate, the ten-point average roughness of the surface of the metal foil can be measured by: removing the metal foil from the metal-clad laminate; and then measuring the ten-point average roughness of the surface of the removed metal foil by the foregoing method.

(2-3. Physical Properties of Metal-Clad Laminate)

(Glass Transition Temperature (Tg))

The heat resistance of a metal-clad laminate can be evaluated based on the glass transition temperature (Tg) of the metal-clad laminate. A higher glass transition temperature (Tg) of the metal-clad laminate indicates better heat resistance of the metal-clad laminate. The glass transition temperature (Tg) of the metal-clad laminate may be not lower than 170° C., not lower than 180° C., not lower than 190° C., or not lower than 200° C. The upper limit of the glass transition temperature (Tg) of the metal-clad laminate is not particularly limited, and is, for example, 400° C. In a case where the metal-clad laminate has a glass transition temperature (Tg) falling within the above range, the metal-clad laminate has excellent heat resistance. The "glass transition temperature (Tg) of a metal-clad laminate" can be determined by carrying out measurement on a metal-clad laminate which includes an insulating layer and metal foil, with use of a thermal mechanical analyzer (TMA) or the like. A specific method of measurement will be described later in Examples. Note that the glass transition temperature (Tg) determined by carrying out measurement on a metal-clad laminate with use of a thermal mechanical analyzer (TMA) or the like is Tg that is derived from the insulating layer. Therefore, the glass transition temperature (Tg) determined by carrying out measurement on an insulating layer with use of a thermal mechanical analyzer (TMA) or the like can also be said to be the glass transition temperature (Tg) of a metal-clad laminate that includes the insulating layer.

(90-Degree Metal Foil Peel Strength)

The adhesiveness between an insulating layer and metal foil of a metal-clad laminate can be evaluated based on 90-degree metal foil peel strength (N/mm). A greater 90-degree metal foil peel strength of a metal-clad laminate indicates better adhesiveness between the insulating layer and the metal foil of the metal-clad laminate. The 90-degree metal foil peel strength of the metal-clad laminate may be more than 0.42 N/mm, not less than 0.43 N/mm, not less than 0.45 N/mm, not less than 0.50 N/mm, or not less than 0.55 N/mm. The upper limit of the 90-degree metal foil peel strength of the metal-clad laminate is not particularly limited, and is, for example, 2 N/mm. In a case where the metal-clad laminate has a 90-degree metal foil peel strength falling within the above range, the metal-clad laminate is excellent in adhesiveness between the insulating layer and the metal foil. In the present specification, the 90-degree metal foil peel strength of a metal-clad laminate is a value determined by carrying out measurement in accordance with JIS C6481. A specific method of measurement will be described later in Examples.

(Interlaminar Fracture Toughness ($G_1c$))

The adhesiveness between an insulating layer and metal foil of a metal-clad laminate is affected also by interlaminar fracture toughness ($G_1c$) ($kJ/m^2$). A greater interlaminar fracture toughness ($G_1c$) of a metal-clad laminate tends to indicate better adhesiveness between the insulating layer and the metal foil of the metal-clad laminate. The interlaminar fracture toughness ($G_1c$) of the metal-clad laminate may be more than 0.25 $kJ/m^2$, not less than 0.26 $kJ/m^2$, not less than 0.28 $kJ/m^2$, not less than 0.30 $kJ/m^2$, not less than 0.32 $kJ/m^2$, not less than 0.34 $kJ/m^2$, not less than 0.36 $kJ/m^2$, not less than 0.38 $kJ/m^2$, not less than 0.40 $kJ/m^2$, not less than 0.42 $kJ/m^2$, or not less than 0.44 $kJ/m^2$. The upper limit of the interlaminar fracture toughness ($G_1c$) of the metal-clad laminate is not particularly limited, and is, for example, 1.00 $kJ/m^2$. In a case where the metal-clad laminate has an interlaminar fracture toughness ($G_1c$) falling within the above range, the metal-clad laminate is even better in adhesiveness between the insulating layer and the metal foil. In the present specification, the interlaminar fracture toughness ($G_1c$) of a metal-clad laminate is a value determined by carrying out measurement in accordance with ISO15024. A specific method of measurement will be described later in Examples.

A metal-clad laminate in accordance with one or more embodiments of the present invention may be configured as described below. Specifically, a metal-clad laminate in accordance with one or more embodiments of the present invention is a metal-clad laminate including: an insulating layer including a resin composition and a fibrous base material; and metal foil which is in contact with the insulating layer, in which: the insulating layer has a dielectric dissipation factor (Df) of not more than 0.0100 at 10 GHz; a surface of the metal foil has a ten-point average roughness (Rz) of not more than 2.0 μm; and the metal-clad laminate has a 90-degree metal foil peel strength of not less than 0.43 N/mm and an interlaminar fracture toughness ($G_1c$) of not less than 0.26 kJ/m$^2$, the 90-degree metal foil peel strength being measured in accordance with JIS C6481, the interlaminar fracture toughness ($G_1c$) being measured in accordance with ISO15024. The metal-clad laminate in accordance with one or more embodiments of the present invention, which includes such a configuration, is therefore excellent in dielectric characteristics and heat resistance and also excellent in adhesiveness between the substrate and metal foil.

With regard to other features of the metal-clad laminate in accordance with one or more embodiments of the present invention, any combination of the features which have been described so far can be used.

3. Method of Producing Metal-Clad Laminate

A method of producing a metal-clad laminate, in accordance with one or more embodiments of the present invention, includes the steps of: preparing a masterbatch which contains (i) a solvent that contains methyl ethyl ketone and (ii) core-shell polymer particles (B) which have a volume-average particle size of 10 nm to 400 nm and which are dispersed in the solvent; preparing a resin varnish by dissolving and mixing the masterbatch and a resin (A) in a solvent that contains methyl ethyl ketone or by dispersing the masterbatch and a resin (A) in a solvent that contains methyl ethyl ketone; preparing a prepreg by impregnating glass cloth with the resin varnish; and laminating metal foil and the prepreg, in which a surface of the metal foil which surface is in contact with the prepreg has a ten-point average roughness (Rz) of not more than 2.0 μm.

The method of producing a metal-clad laminate, in accordance with one or more embodiments of the present invention, includes the above-stated configuration, is therefore capable of providing a metal-clad laminate that is excellent in dielectric characteristics and heat resistance and also excellent in adhesiveness between the insulating layer (substrate) and metal foil.

The method of producing a metal-clad laminate, in accordance with one or more embodiments of the present invention, can be suitably used to produce the metal-clad laminate described in the [2. Metal-clad laminate] section. Therefore, with regard to the following features: the resin (A); the core-shell polymer particles (B); the fibrous base material and the metal foil; and the inorganic filler (D) and the flame retardant and the like in the method of producing a metal-clad laminate in accordance with one or more embodiments of the present invention, any combination of the features described in the [2. Metal-clad laminate] section can be used.

(Step of Preparing Masterbatch)

The core-shell polymer particles (B) are produced by a well-known method as described earlier, and the eventually obtained core-shell polymer particles (B) are dispersed in an aqueous solvent. That is, the core-shell polymer particles (B) in the form of an aqueous dispersion (also referred to as an aqueous latex) may be obtained by a well-known method. Therefore, the step of preparing a masterbatch can also be said to be a step of replacing, with a solvent containing methyl ethyl ketone, the solvent (i.e., the aqueous solvent) contained in the dispersion slurry that contains the core-shell polymer particles (B). The core-shell polymer particles (B) may be produced via multistage emulsion polymerization and obtained in the form of an aqueous latex.

The solvent that contains methyl ethyl ketone (hereinafter may be referred to a "solvent" for short) may contain some other solvent(s) in addition to methyl ethyl ketone. Examples of solvents other than methyl ethyl ketone, which can be contained in the solvent, include (a) water, (b) aromatic hydrocarbons such as toluene and xylene, (c) esters such as ethyl acetate and propylene glycol monomethyl ether acetate, (d) ketones such as acetone, methyl ethyl ketone, methyl isobutyl ketone, and cyclohexanone, and (e) solvents such as butanol, methyl cellosolve, butyl cellosolve, propylene glycol monomethyl ether, dimethylformamide, dimethylacetamide, dimethyl sulfoxide, and N-methyl-2-pyrrolidone.

The following description specifically discusses an embodiment of the step of preparing a masterbatch. The step of preparing a masterbatch may include the following first to three substeps in the order named: the first substep involving obtaining a loose agglutinate of core-shell polymer particles from an aqueous dispersion containing the core-shell polymer particles (B) (preferably an aqueous latex obtained via emulsion polymerization); the second substep involving obtaining, from the loose agglutinate of core-shell polymer particles, a particle dispersion that contains the core-shell polymer particles (B) and a solvent; and the third substep involving evaporating the solvent and/or water from the particle dispersion.

The following description more specifically discusses the first substep, the second substep, and the third substep.

The first substep is a substep involving: mixing an aqueous dispersion that contains the core-shell polymer particles (B) with a solvent; and then further mixing the resultant mixture with water to obtain a slurry that contains a buoyant loose agglutinate of core-shell polymer particles.

The second substep is a substep involving: removing a liquid phase from the slurry to obtain a loose agglutinate of core-shell polymer particles; and thereafter mixing the loose agglutinate of core-shell polymer particles with a solvent to obtain a particle dispersion that contains the core-shell polymer particles (B) and the solvent. The particle dispersion obtained in the second substep contains water; therefore, the particle dispersion can also be said to be a water-containing particle dispersion.

A mixing apparatus for use in the first substep and the second substep can be any of known apparatuses. For example, a general apparatus such as a stirring vessel with a stirrer blade may be used. Alternatively, a static mixer and an in-line mixer (mixing apparatus is mounted in a pipe) or the like may be used.

The third substep is a substep involving evaporating the solvent and/or water from the particle dispersion.

A method of evaporating the solvent and/or water from the particle dispersion in the third substep is not particularly limited, and can be any of known methods. Examples of the method include (a) a method involving introducing the particle dispersion in a vessel and distilling off the solvent and/or water with heat under reduced pressure, (b) a method involving subjecting a dry gas and the mixture to countercurrent contact within the vessel, (c) a method of a continuous type such as using a falling-film evaporator, (d) a method using an extruder or a continuous stirring vessel each of which includes a devolatilization mechanism, and the like method. Conditions such as the temperature at which the water is distilled off and the time for the distillation can be selected appropriately, provided that the quality of the resulting masterbatch is not impaired.

By carrying out the first to third substeps in the order named, it is possible to easily obtain a masterbatch in which the core-shell polymer particles (B) are dispersed stably at high concentration. Since the first to third substeps are easy to carry out, the step of preparing a masterbatch may include the first to third substeps.

With regard to the amount of water contained in the masterbatch obtained in the step of preparing a masterbatch, the amount of water contained in 100 weight % of the masterbatch may be not more than 1.00 weight %, not more than 0.50 weight %, not more than 0.30 weight %, not more than 0.20 weight %, not more than 0.15 weight %, not more than 0.14 weight %, not more than 0.13 weight %, not more than 0.12 weight %, or not more than 0.11 weight %. A masterbatch containing water in an amount of not more than 1 weight % is advantageous in that the resulting insulating layer will have excellent surface appearance and there is no possibility that the insulating layer will foam.

The amount of the core-shell polymer particles (B) contained in the masterbatch obtained in the step of preparing a masterbatch, with respect to the total weight (100 weight %) of the masterbatch, may be 20 weight % to 40 weight %, 22 weight % to 38 weight %, or 24 weight % to 36 weight %. In a case where the amount of the core-shell polymer particles (B) contained in the masterbatch is not less than 20 weight %, the solvent is not excessively brought into a resin varnish for use in the production of an insulating layer, resulting in good workability. In a case where the amount of the core-shell polymer particles (B) contained in the masterbatch is not more than 40 weight %, the masterbatch has an appropriate viscosity, resulting in good handleability.

The combined amount of the solvent(s) contained in the masterbatch obtained in the step of preparing a masterbatch, with respect to the total weight (100 weight %) of the masterbatch, may be 60 weight % to 80 weight %, 62 weight % to 78 weight %, or 64 weight % to 76 weight %, for the same reasons as those for the amount of the core-shell polymer particles (B).

(Step of Preparing Resin Varnish)

The step of preparing a resin varnish can also be said to be a step of preparing a resin varnish by mixing the masterbatch and a resin (A) in a solvent that contains methyl ethyl ketone or by dispersing the masterbatch and a resin (A) in a solvent that contains methyl ethyl ketone.

The resin varnish is one obtained by dissolving and mixing a resin (A) and a core-shell polymer particle (B)-containing masterbatch in a solvent or by dispersing a resin (A) and a core-shell polymer particle (B)-containing masterbatch in a solvent. As used herein, the term "dissolving and mixing" means mixing by dissolution.

The resin varnish can also be said to be one that is obtained by mixing a resin (A) and a core-shell polymer particle (B)-containing masterbatch in a solvent or by dispersing a resin (A) and a core-shell polymer particle (B)-containing masterbatch in a solvent.

The resin varnish may further contain an inorganic filler (D), a flame retardant, an additive, and/or the like.

The resin varnish may further contain a reaction initiator. In a case where the resin varnish contains a reaction initiator, it is possible to improve the Tg and the heat resistance of the resulting metal-clad laminate. In a case where the resin (A) contains a crosslinking agent and where the resin varnish contains a reaction initiator, it is possible to increase the reactivity between a resin and/or copolymer and the crosslinking agent in the resin (A). This makes it possible to further improve the Tg and the heat resistance of the resulting metal-clad laminate.

The reaction initiator is not particularly limited, provided that the reaction initiator is capable of accelerating (a) the curing reaction of the resin (A) and/or (b) the curing reaction between the resin and/or copolymer and the crosslinking agent in the resin (A). Specific examples of the reaction initiator include oxidizing agents such as $\alpha,\alpha'$-bis(t-butylperoxy-m-isopropyl)benzene, 2,5-dimethyl-2,5-bis(t-butylperoxy)hexane, benzoyl peroxide, 3,3',5,5'-tetramethyl-1,4-diphenoquinone, chloranil, 2,4,6-tri-t-butylphenoxyl, t-butylperoxy isopropyl monocarbonate, and azobisisobutyronitrile. Furthermore, a metal carboxylate and/or the like can be used in combination with the reaction initiator as necessary. This makes it possible to further accelerate (a) the curing reaction of the resin (A) and/or (b) the curing reaction between the resin and/or copolymer and the crosslinking agent in the resin (A). Among such reaction initiators, $\alpha,\alpha'$-bis(t-butylperoxy-m-isopropyl)benzene is preferred. Since $\alpha,\alpha'$-bis(t-butylperoxy-m-isopropyl)benzene starts to react at relatively high temperature, the use of $\alpha,\alpha'$-bis(t-butylperoxy-m-isopropyl)benzene makes it possible to suppress acceleration of the curing reaction when no curing is necessary during, for example, drying of a prepreg, and thus possible to reduce a reduction in preservability of the resin varnish. Furthermore, $\alpha,\alpha'$-bis(t-butylperoxy-m-isopropyl)benzene has low volatility, and therefore does not volatilize when the prepreg is dried and when the resin varnish is in storage, i.e., good stability is achieved. Such reaction initiators may be used alone or in combinations of two or more.

In a case where the resin varnish contains the reaction initiator, the amount of the reaction initiator contained may be 0.01 parts by weight to 3 parts by weight with respect to the combined weight (100 parts by weight) of the resin (A) and the core-shell polymer particles (B).

The following description specifically discusses the step of preparing a resin varnish. First, (a) a resin (A) and a core-shell polymer particle (B)-containing masterbatch, and (b) optionally, an optional component(s) that can dissolve in a solvent that contains methyl ethyl ketone, such as a compatible flame retardant, are introduced into the solvent and are mixed. In so doing, heating may be carried out as necessary. With the above introduction and mixing, the resin (A) and the component(s) that can dissolve in the solvent that contains methyl ethyl ketone dissolve in the solvent, and the core-shell polymer particles (B) are dispersed in the solvent. Then, optionally, an optional component(s) that do/does not dissolve in the solvent that contains methyl ethyl ketone, such as an inorganic filler (D) and an incompatible flame retardant, is/are added. Then, these components are dispersed in the solvent until a certain dispersion state is reached, and thereby a resin varnish is obtained. The mixing and dispersing can be carried out with use of an apparatus such as a ball mill, a bead mill, a planetary mixer, or a roll mill.

Note that, in a case where the resin (A) contains a crosslinking agent, the crosslinking agent may volatilize when a prepreg is produced with use of the resin varnish. Therefore, in order to allow the finally resulting metal-clad laminate to contain the crosslinking agent in the amount described earlier in the (Resin (A)) section, it is necessary to set the amount of the crosslinking agent contained in the resin (A) in consideration of the amount of volatilization of the crosslinking agent during production of the prepreg.

(Step of Preparing Prepreg)

The following description specifically discusses the step of preparing a prepreg. A prepreg can be prepared by: impregnating a fibrous base material with the resin varnish; and then drying the obtained fibrous base material.

The resin varnish is impregnated into the fibrous base material by immersion, application, and/or the like. The impregnation can be carried out a plurality of times as necessary. If the impregnation is carried out a plurality of times, the following configuration can be employed: the impregnation is carried out repeatedly with use of a plurality of types of resin varnishes varying in composition and/or concentration; and thereby desired compositions (relative amounts of components) and a desired resin amount are eventually achieved.

The fibrous base material impregnated with the resin varnish is heated under a certain heating condition, for example, at 80° C. to 170° C. for 1 minute to 10 minutes, and thereby the solvent is removed. In this way, a prepreg whose resin is in a partially cured state is obtained.

(Step of Laminating Metal Foil and Prepreg)

The following description specifically discusses the step of laminating metal foil and prepreg. Metal foil is placed on both the top and bottom faces or one of the top and bottom faces of a sheet of prepreg or on both the top and bottom faces or one of the top and bottom faces of a stack of a plurality of sheets of prepreg, and the obtained stack is molded with heat and pressure so that the foil and prepreg adhere together. With this, it is possible to obtain a metal-clad laminate having the metal foil on both faces thereof or a metal-clad laminate having the metal foil on one face thereof. The heat and pressure conditions can be set appropriately according to the thickness of the metal-clad laminate to be produced, the composition of the resin varnish of the prepreg, and the like. For example, temperature can be 170° C. to 220° C., pressure can be 1.5 MPa to 5.0 MPa, and time can be 60 minutes to 150 minutes.

Note that, although the resin contained in the prepreg is in a partially-cured state, the resin is cured completely in the step of laminating metal foil and prepreg. Furthermore, in the step of laminating metal foil and prepreg, adhesion between the metal foil and the prepreg occurs concurrently with the curing of the resin in the prepreg. In other words, the metal-clad laminate includes a cured prepreg and metal foil. Furthermore, in the metal-clad laminate, the portion other than the metal foil is an insulating layer. In other words, the cured prepreg may be expressed as the "insulating layer".

[4. Printed Wiring Board]

A printed wiring board in accordance with one or more embodiments of the present invention is produced with use of the metal-clad laminate described in the [2. Metal-clad laminate] section. The printed wiring board in accordance with one or more embodiments of the present invention includes the above configuration, and therefore is excellent in dielectric characteristics and heat resistance and also excellent in adhesiveness between a substrate and metal foil.

The printed wiring board in accordance with one or more embodiments of the present invention can be produced by, for example, a method involving: forming a circuit by, for example, etching the metal foil at a surface of the metal-clad laminate described in the [2. Metal-clad laminate] section; and thereby producing a printed wiring board in which a conductor pattern is disposed as the circuit at the surface of the laminate.

Embodiments of the present invention may be as follows.

[1] A metal-clad laminate including: an insulating layer including a resin composition and a fibrous base material; and metal foil which is in contact with the insulating layer, in which: the resin composition contains a resin (A) having a dielectric dissipation factor (Df) of not more than 0.0100 at 10 GHz, and core-shell polymer particles (B) having a volume-average particle size of 10 nm to 400 nm; and a surface of the metal foil has a ten-point average roughness (Rz) of not more than 2.0 µm.

[2] The metal-clad laminate as described in [1], in which: the core-shell polymer particles (B) include a core layer composed of a rubber elastic body obtained by polymerizing (i) not less than 50 weight % and not more than 100 weight % of at least one type of monomer selected from the group consisting of diene-based monomers and (meth)acrylic ester-based monomers and (ii) not less than 0% and not more than 50 weight % of a copolymerizable vinyl monomer; and the copolymerizable vinyl monomer is at least one type of monomer selected from the group consisting of aromatic vinyl compounds, vinyl cyanide compounds, unsaturated carboxylic acid derivatives, (meth)acrylamide derivatives, and maleimide derivatives.

[3] The metal-clad laminate as described in [1] or [2], in which not less than 30 weight % in 100 weight % of the core-shell polymer particles (B) is composed of styrene unit.

[4] The metal-clad laminate as described in any one of [1] to [3], in which the core-shell polymer particles (B) include a shell layer that contains an epoxy group.

[5] The metal-clad laminate as described in any one of [1] to [4], in which the resin (A) includes a polyphenylene ether that contains a crosslinkable functional group.

[6] The metal-clad laminate as described in [5], in which the polyphenylene ether is a modified polyphenylene ether which has a terminal modified with a substituent containing an unsaturated carbon-carbon double bond.

[7] A metal-clad laminate including: an insulating layer including a resin composition and a fibrous base material; and metal foil which is in contact with the insulating layer, in which: the insulating layer has a dielectric dissipation factor (Df) of not more than 0.0100 at 10 GHz; a surface of the metal foil has a ten-point average roughness (Rz) of not more than 2.0 µm; and the metal-clad laminate has a 90-degree metal foil peel strength of not less than 0.43 N/mm and an interlaminar fracture toughness ($G_1c$) of not less than 0.26 kJ/m², the 90-degree metal foil peel strength being measured in accordance with JIS C6481, the interlaminar fracture toughness ($G_1c$) being measured in accordance with ISO15024.

[8] A printed wiring board produced with use of a metal-clad laminate described in any one of [1] to [7].

[9] A method of producing a metal-clad laminate, including the steps of: preparing a masterbatch which contains (i) a solvent that contains methyl ethyl ketone and (ii) core-shell polymer particles (B) which have a volume-average particle size of 10 nm to 400 nm and which are dispersed in the solvent; preparing a resin varnish by dissolving and mixing the masterbatch and a resin (A) in a solvent that contains methyl ethyl ketone or by dispersing the masterbatch and a resin (A) in a solvent that contains methyl ethyl ketone; preparing a prepreg by impregnating glass cloth with the resin varnish; and laminating metal foil and the prepreg, in which a surface of the metal foil which surface is in contact with the prepreg has a ten-point average roughness (Rz) of not more than 2.0 µm.

EXAMPLES

The following description will specifically discuss one or more embodiments of the present invention with reference to Examples. Note that embodiments of the present invention are not limited to these examples.

The following describes methods of measuring physical properties in Examples and Comparative Examples.

[Volume-Average Particle Size]

The volume-average particle sizes of rubber particles and core-shell polymer particles were measured with use of a particle size measurer (Microtrac UPA manufactured by Nikkiso Co., Ltd.).

[Dielectric dissipation factor of resin (A)] A reaction initiator or a reaction catalyst suitable for a resin (A) was added to the resin (A) to obtain a resin (A) composition. The type of resin (A) and the type of reaction initiator or reaction catalyst used are as shown in Tables 1 to 3. The ratio between the amount of the resin (A) and the amount of the reaction initiator or reaction catalyst used is as shown in Tables 1 to 3. The resin (A) composition was subjected to hot pressing at 200° C. for 90 minutes, and thereby an evaluation sheet 100 mm in length×2 mm in width×0.5 mm in thickness was prepared. The obtained evaluation sheet was measured for its dielectric dissipation factor at a frequency of 10 GHz, with use of a cavity resonator (manufactured by KANTO Electronic Application and Development Inc.). The obtained dielectric dissipation factor was used as the dielectric dissipation factor of the resin (A).

[Dielectric Dissipation Factor of Core-Shell Polymer Particles (B)]

A methyl ethyl ketone (MEK) dispersion, composed of MEK and core-shell polymer particles dispersed in the MEK, was dried to obtain core-shell polymer particle residues. The obtained core-shell polymer particle residues were subjected to hot pressing at 190° C. for 30 minutes, and thereby an evaluation sheet 100 mm in length×2 mm in width×1 mm in thickness was prepared. The obtained evaluation sheet was measured for its dielectric dissipation factor at a frequency of 10 GHz, with use of a cavity resonator (manufactured by KANTO Electronic Application and Development Inc.). The obtained dielectric dissipation factor was used as the dielectric dissipation factor of the core-shell polymer particles (B). Note that the MEK dispersion, composed of MEK and core-shell polymer particles dispersed in the MEK, for use in measurement of the dielectric dissipation factor corresponds to the MEK dispersion described later in each of Production Examples of core-shell polymer particles (B).

[Dielectric Dissipation Factor of Insulating Layer]

Metal of a metal-clad laminate was dissolved with use of an etchant to obtain an insulating layer. The obtained insulating layer was cut to obtain a test piece 100 mm in length×1.5 mm in width×1.5 mm in thickness. The obtained test piece was measured for its dielectric dissipation factor at a frequency of 10 GHz, with use of a cavity resonator (manufactured by KANTO Electronic Application and Development Inc.). The obtained dielectric dissipation factor was used as the dielectric dissipation factor of the insulating layer.

[Glass Transition Temperature (Tg)]

The Tg of a metal-clad laminate was measured with use of a thermal mechanical analyzer (TMA), in accordance with the instructions included with the thermal mechanical analyzer.

[90-Degree Metal Foil Peel Strength]

The 90-degree metal foil peel strength of a metal-clad laminate was measured in accordance with JIS C6481, specifically in the following manner. First, metal foil was placed on the prepreg obtained in each of Examples and Comparative Examples so that a trace of metal foil 10 mm in width and 100 mm in length would be formed. Next, the obtained stack was molded with heat and pressure so that the foil and prepreg adhere together to obtain a metal-clad laminate. The metal foil was peeled from the obtained metal-clad laminate at a rate of 50 mm/minute with use of a tensile tester, and the peel-strength at that time was measured. The obtained value was used as 90-degree metal foil peel strength.

[Interlaminar Fracture Toughness ($G_1c$)]

The $G_1c$ of a metal-clad laminate was measured in accordance with ISO15024. A test piece for a double cantilever beam (DCB) test was prepared by cutting the metal-clad laminate into a piece 20 mm in width and 100 mm in length. The $G_1c$ was measured with use of the test piece.

The following are main components and materials used in Examples and Comparative Examples.

(Resin (A))

Resins (A-1) to (A-4) having the compositions shown in Table 1 were used. Each resin and crosslinking agent used here are as follows.

<Resin>

Methacrylic-modified polyphenylene ether: SA9000 (manufactured by SABIC, number-average molecular weight Mn: 1,000 to 3,000, dielectric dissipation factor at 10 GHz: 0.005)

Hydrocarbon resin; Ricon100 (manufactured by CrayValley)

Cyanate resin: 2,2-bis(4-cyanatophenyl)propane (manufactured by Techia)

Bismaleimide: IR-3000 (manufactured by Nippon Kayaku Co., Ltd.)

<Crosslinking Agent>

Triallyl isocyanurate: TAIC (manufactured by Nihon Kasei CO., LTD.)

(Core-Shell Polymer Particles (B))

Core-shell polymer particles (six types) produced by methods described later in Production Examples 1 to 6

(Inorganic Filler (D))

Silica surface-treated with vinyl silane: Admafine (manufactured by Admatechs, 70 weight % dispersion (dispersion medium: MEK), average particle size: 0.5 μm)

(Other)

<Reaction Initiator>

2,5-dimethyl-2,5-bis(t-butylperoxy)hexane: Luperox101 (manufactured by Arkema)

<Reaction Initiator>

Zinc octoate: zinc octoate (manufactured by Nacalai Tesque, Inc.)

(Fibrous Base Material)

Glass cloth: Glass cloth (7628, E-glass) (manufactured by Nitto Boseki Co., Ltd.)

(Metal Foil)

Copper foil: HS2-VSP (manufactured by MITSUI KINZOKU, Rz=1 μm)

Copper foil: MLS-G (manufactured by MITSUI KINZOKU, Rz=3.8 μm)

TABLE 1

| | | Unit | A-1 | A-2 | A-3 | A-4 |
|---|---|---|---|---|---|---|
| Compositions | Methacrylic-modified polyphenylene ether | part by weight | 70 | 47.855 | 72.25 | — |
| | Hydrocarbon resin | part by weight | — | 8.445 | 12.75 | — |
| | Cyanate resin | part by weight | — | — | — | 50 |
| | Bismaleimide | part by weight | — | — | — | 50 |
| | Crosslinking agent  Triallyl isocyanurate | part by weight | 30 | 8.7 | 15 | — |
| Physical property | Dielectric dissipation factor | — | 0.0062 | 0.0068 | 0.01 or less | 0.0040 |

\* Values indicated in the unit of part by weight are those of solid content.

Core-shell polymer particles (B) were produced in the following manner.

Production Example 1

Into a 100 L pressure-resistant polymerization apparatus were introduced 200 parts by weight of water, 0.03 parts by weight of tripotassium phosphate, 0.002 parts by weight of disodium ethylenediaminetetraacetate (EDTA), 0.001 parts by weight of ferrous sulfate heptahydrate, and 1.55 parts by weight of sodium dodecylbenzenesulfonate (SDBS). While the materials thus introduced were stirred, the headspace of the pressure-resistant polymerization apparatus was replaced with nitrogen, so as to sufficiently remove oxygen from the inside of the pressure-resistant polymerization apparatus. Thereafter, 100 parts by weight of butadiene (Bd) was introduced into the system, and the temperature inside the pressure-resistant polymerization apparatus was raised to 45° C. Thereafter, 0.03 parts by weight of paramenthane hydroperoxide (PHP) was introduced into the system, subsequently 0.10 parts by weight of sodium formaldehyde sulfoxylate (SFS) was introduced into the system, and polymerization was commenced. At each of the following times, 0.025 parts by weight of paramenthane hydroperoxide (PHP) was introduced into the system: the time 3 hours had elapsed from the start of polymerization, the time 5 hours had elapsed from the start of polymerization, and the time 7 hours had elapsed from the start of polymerization. Furthermore, at each of the following times, 0.0006 parts by weight of EDTA and 0.003 parts by weight of ferrous sulfate heptahydrate were introduced into the system: the time 4 hours had elapsed from the start of polymerization, the time 6 hours had elapsed from the start of polymerization, and the time 8 hours had elapsed from the start of polymerization. At the time 15 hours had elapsed from the start of polymerization, devolatilization was carried out under reduced pressure to remove the residual monomer from the system, so as to end the polymerization. In this way, a polybutadiene rubber latex (R-1) containing a polybutadiene rubber as a main component was obtained. The volume-average particle size of the polybutadiene rubber particles contained in the polybutadiene rubber latex (R-1) thus obtained was 80 nm.

Into a pressure-resistant polymerization apparatus were introduced 21 parts by weight of the polybutadiene rubber latex (R-1) (including 7 parts by weight of polybutadiene rubber), 185 parts by weight of deionized water, 0.03 parts by weight of tripotassium phosphate, 0.002 parts by weight of EDTA, and 0.001 parts by weight of ferrous sulfate heptahydrate. While the materials thus introduced were stirred, the headspace of the pressure-resistant polymerization apparatus was replaced with nitrogen, so as to sufficiently remove oxygen from the inside of the pressure-resistant polymerization apparatus. Thereafter, 93 parts by weight of Bd was introduced into the system, and the temperature inside the pressure-resistant polymerization apparatus was raised to 45° C. Thereafter, 0.02 parts by weight of PHP was introduced into the system, subsequently 0.10 parts by weight of SFS was introduced into the system, and polymerization was commenced. At three-hour intervals from the start of the polymerization to 24 hours after the start of polymerization, 0.025 parts by weight of PHP, 0.0006 parts by weight of EDTA, and 0.003 parts by weight of ferrous sulfate heptahydrate were introduced into the system each time. At the time 30 hours had elapsed from the start of polymerization, devolatilization was carried out under reduced pressure to remove the residual monomer from the system, so as to end the polymerization. In this way, a polybutadiene rubber latex (R-2) containing a polybutadiene rubber as a main component was obtained. The volume-average particle size of the polybutadiene rubber particles contained in the latex thus obtained was 200 nm.

Into a glass reaction vessel were introduced 241 parts by weight of the foregoing polybutadiene rubber latex (R-2) (including 80 parts by weight of polybutadiene rubber particles) and 65 parts by weight of water. The glass reaction vessel had a thermometer, a stirrer, a reflux condenser, a nitrogen inlet, and a monomer adding device. The gas in the glass reaction vessel was replaced with nitrogen, and the materials thus introduced were stirred at 60° C. Next, 0.004 parts by weight of EDTA, 0.001 parts by weight of ferrous sulfate heptahydrate, and 0.2 parts by weight of SFS were added into the system. Thereafter, a mixture of 2 parts by weight of styrene (St), 12 parts by weight of methyl methacrylate (MMA), 1 part by weight of acrylonitrile (AN), 5 parts by weight of glycidyl methacrylate (GMA), and 0.08 parts by weight of t-butyl hydroperoxide (TBP) was added continuously into the system over 110 minutes. Thereafter, 0.04 parts by weight of TBP was added into the system, and stirred for another hour to finish polymerization. In this way, an aqueous latex (L-1) containing core-shell polymer particles was obtained. The volume-average particle size of the core-shell polymer particles contained in the aqueous latex thus obtained was 210 nm.

Into a 1 L mixing vessel at 30° C. was introduced 126 parts by weight of methyl ethyl ketone (MEK). While the introduced MEK was stirred, 126 parts by weight of the aqueous latex (L-1) containing core-shell polymer particles was introduced into the system. Once the materials thus introduced had been mixed uniformly, 200 parts by weight of water was introduced into the system at a feed rate of 80 parts by weight per minute. After the water was supplied, the stirring was promptly stopped, and a slurry containing a buoyant loose agglutinate of core-shell polymer particles was obtained.

Next, while the loose agglutinate of core-shell polymer particles was remaining in the mixing vessel, 350 parts by weight of liquid phase was let out from an outlet in a lower part of the mixing vessel to obtain the agglutinate of loose core-shell polymer particles. To the loose agglutinate of core-shell polymer particles thus obtained was added 150 parts by weight of MEK, and these were mixed to obtain a water-containing MEK dispersion in which the core-shell polymer particles were dispersed.

The obtained water-containing MEK dispersion was transferred to a 1 L vessel (which has an internal diameter of 100 mm and which has therein a stirrer with a 90 mm anchor blade). The vessel had a jacket, had an inner diameter of 100 mm, and had placed therein the stirrer with the 90 mm anchor blade. Then, the jacket temperature was set to 70° C. and the degree of pressure reduction was set to 200 torr, and the MEK and water were distilled off until the concentration of core-shell polymer particles in the contents of the vessel reached 20 weight %.

MEK was added into the vessel in an amount such that the concentration of the core-shell polymer particles in the contents of the vessel would be 10 weight %, and the contents were mixed uniformly. Next, the jacket temperature was set to 70° C. and the degree of pressure reduction was set to 200 torr, and the MEK and water were distilled off until the concentration of the core-shell polymer particles in the contents of the vessel reached 25 weight %. Then, nitrogen gas was introduced into the vessel to allow the internal pressure of the vessel to return to atmospheric pressure, and an MEK dispersion containing core-shell polymer particles (M-1) (dehydrated) was obtained. The amount of water contained in 100 weight % of the MEK dispersion (dehydrated) (M-1) was 0.10 weight %. The dielectric dissipation factor of the obtained core-shell polymer particles was 0.0110.

Production Example 2

Into a 100 L pressure-resistant polymerization apparatus were introduced 200 parts by weight of water, 0.03 parts by weight of tripotassium phosphate, 0.25 parts by weight of potassium dihydrogenphosphate, 0.002 parts by weight of EDTA, 0.001 parts by weight of ferrous sulfate heptahydrate, and 1.5 parts by weight of SDBS. While the materials thus introduced were stirred, the headspace of the pressure-resistant polymerization apparatus was replaced with nitrogen, so as to sufficiently remove oxygen from the inside of the pressure-resistant polymerization apparatus. Thereafter, 75 parts by weight of Bd and 25 parts by weight of styrene were introduced into the system, and the temperature inside the pressure-resistant polymerization apparatus was raised to 45° C. Thereafter, 0.015 parts by weight of PHP was introduced into the system, subsequently 0.04 parts by weight of SFS was introduced into the system, and polymerization was commenced. At the time 4 hours had elapsed from the start of polymerization, 0.01 parts by weight of PHP, 0.0015 parts by weight of EDTA, and 0.001 parts by weight of ferrous sulfate heptahydrate were introduced into the system. At the time 10 hours had elapsed from the start of polymerization, devolatilization was carried out under reduced pressure to remove the residual monomer from the system, so as to end the polymerization. In this way, a styrene-butadiene rubber latex (R-3) was obtained. The volume-average particle size of the styrene-butadiene rubber particles contained in the styrene-butadiene rubber latex (R-3) thus obtained was 100 nm.

Into a glass reaction vessel were introduced 241 parts by weight of the foregoing styrene-butadiene rubber latex (R-3) (including 80 parts by weight of styrene-butadiene rubber particles) and 65 parts by weight of water. The glass reaction vessel had a thermometer, a stirrer, a reflux condenser, a nitrogen inlet, and a monomer adding device. The gas in the glass reaction vessel was replaced with nitrogen, and the materials thus introduced were stirred at 60° C. Next, 0.004 parts by weight of EDTA, 0.001 parts by weight of ferrous sulfate heptahydrate, and 0.2 parts by weight of SFS were added into the system. Thereafter, 2 parts by weight of triallyl isocyanurate (TRIC) and 0.07 parts by weight of cumene hydroperoxide (CHP) were added into the system, and were stirred for 60 minutes. Thereafter, a mixture of 12 parts by weight of St, 4 parts by weight of AN, 4 parts by weight of GMA, and 0.08 parts by weight of TBP was added continuously into the system over 110 minutes. Thereafter, 0.04 parts by weight of TBP was added into the system, and stirred for another hour to finish polymerization. In this way, an aqueous latex (L-2) containing core-shell polymer particles was obtained. The volume-average particle size of the core-shell polymer particles contained in the aqueous latex thus obtained was 110 nm.

Next, the same operations as described in Production Example 1 were carried out, except that the aqueous latex (L-2) was used instead of the aqueous latex (L-1). In this way, an MEK dispersion (dehydrated) (M-2) was obtained. The amount of water contained in 100 weight % of the MEK dispersion (dehydrated) (M-2) was 0.10 weight %. The dielectric dissipation factor of the obtained core-shell polymer particles was 0.0070.

Production Example 3

Into a glass reaction vessel were introduced 241 parts by weight of the foregoing styrene-butadiene rubber latex (R-3) (including 80 parts by weight of styrene-butadiene rubber particles) and 65 parts by weight of water. The glass reaction vessel had a thermometer, a stirrer, a reflux condenser, a nitrogen inlet, and a monomer adding device. The gas in the glass reaction vessel was replaced with nitrogen, and the materials thus introduced were stirred at 60° C. Next, 0.004 parts by weight of EDTA, 0.001 parts by weight of ferrous sulfate heptahydrate, and 0.2 parts by weight of SFS were added into the system. Thereafter, 2 parts by weight of TAIC and 0.07 parts by weight of CHP were added into the system, and were stirred for 60 minutes. Thereafter, a mixture of 12 parts by weight of St, 4 parts by weight of AN, 4 parts by weight of MMA, and 0.08 parts by weight of TBP was added continuously into the system over 110 minutes. Thereafter, 0.04 parts by weight of TBP was added into the system, and stirred for another hour to finish polymerization. In this way, an aqueous latex (L-3) containing core-shell polymer particles was obtained. The volume-average particle size of the core-shell polymer particles contained in the aqueous latex thus obtained was 110 nm.

Next, the same operations as described in Production Example 1 were carried out, except that the aqueous latex (L-3) was used instead of the aqueous latex (L-1). In this way, an MEK dispersion (dehydrated) (M-3) was obtained. The amount of water contained in 100 weight % of the MEK dispersion (dehydrated) (M-3) was 0.12 weight %. The dielectric dissipation factor of the obtained core-shell polymer particles was 0.0068.

Production Example 4

Into a glass reaction vessel were introduced 182 parts by weight of deionized water, 0.006 parts by weight of EDTA, 0.0015 parts by weight of ferrous sulfate heptahydrate, 0.2 parts by weight of SFS, and 0.15 parts by weight of SDBS. The glass reaction vessel had a thermometer, a stirrer, a reflux condenser, a nitrogen inlet, a monomer adding device, and an emulsifying agent adding device. The gas in the glass reaction vessel was replaced with nitrogen, and, while the materials thus introduced were stirred, the temperature inside the glass reaction vessel was raised to 60° C. Next, a mixture of 75 parts by weight of St, 1.5 parts by weight of allyl methacrylate (ALMA), and 0.024 parts by weight of CHP was dropped continuously into the system over 200 minutes. After the mixture had been dropped, stirring was carried out for 0.5 hours to finish polymerization. In this way, an aqueous latex (R-4) containing a crosslinked polymer layer of fine polymer particles was obtained. Next, a mixture of 20 parts by weight of MMA, 5 parts by weight of GMA, and 0.08 parts by weight of TBP was continuously added into the system over 110 minutes. Then, 0.04 parts by weight of TBP was added into the system, and stirred for another hour to finish polymerization. In this way, an aqueous latex (L-4) containing core-shell polymer particles was obtained. The volume-average particle size of the core-shell polymer particles contained in the aqueous latex thus obtained was 122 nm.

Next, the same operations as described in Production Example 1 were carried out, except that the aqueous latex (L-4) was used instead of the aqueous latex (L-1). In this way, an MEK dispersion (dehydrated) (M-4) was obtained. The amount of water contained in 100 weight % of the MEK dispersion (dehydrated) (M-4) was 0.14 weight %. The dielectric dissipation factor of the obtained core-shell polymer particles was 0.0060.

Production Example 5

220 parts by weight of deionized water was introduced into a glass reaction vessel, 8.5 parts by weight of butyl acrylate (BA), 0.17 parts by weight of ALMA, 0.16 parts by weight of SDBS, and 0.003 parts by weight of CHP were introduced into the glass reaction vessel, and 0.0056 parts by weight of EDTA, 0.0014 parts by weight of ferrous sulfate heptahydrate, and 0.06 parts by weight of SFS were further introduced into the glass reaction vessel. The glass reaction vessel had a thermometer, a stirrer, a reflux condenser, a nitrogen inlet, a monomer adding device, and an emulsifying agent adding device. Next, the temperature inside the glass reaction vessel was raised to 60° C. Next, a mixture composed of 91.5 parts by weight of BA, 1.87 parts by weight of ALMA, and 0.03 parts by weight of CHP was continuously added into the system over 350 minutes. After the mixture was added, 0.15 parts by weight of SDBS was added into the system four times at 60-minute intervals. In this way, a latex (R-5) containing acrylic rubber particles was obtained. The volume-average particle size of the acrylic rubber particles contained in the latex thus obtained was 300 nm.

Next, 0.0058 parts by weight of EDTA, 0.0014 parts by weight of ferrous sulfate heptahydrate, and 0.25 parts by weight of SFS were added to 53.8 parts by weight of the acrylic rubber latex (R-5) (including 17.6 parts by weight of acrylic rubber particles), and then 51.35 parts by weight of BA, 1.05 parts by weight of ALMA, and 0.015 parts by weight of CHP were further continuously added over 130 minutes. Next, 0.15 parts by weight of SDBS was added into the system three times at 60-minute intervals, and then a mixture of 25 parts by weight of MMA, 5 parts by weight of GMA, and 0.08 parts by weight of TBP was continuously added over 180 minutes. Then, 0.04 parts by weight of TBP was added into the system, and stirred for another 30 minutes to finish polymerization. In this way, an aqueous latex (L-5) containing a core-shell polymer was obtained. The volume-average particle size of the core-shell polymer contained in the aqueous latex thus obtained was 500 nm.

Next, the same operations as described in Production Example 1 were carried out, except that the aqueous latex (L-5) was used instead of the aqueous latex (L-1). In this way, an MEK dispersion (dehydrated) (M-5) was obtained. The amount of water contained in 100 weight % of the MEK dispersion (dehydrated) (M-5) was 0.11 weight %. The dielectric dissipation factor of the obtained core-shell polymer particles was 0.0180.

Production Example 6

220 parts by weight of deionized water was introduced into a glass reaction vessel, 6.9 parts by weight of BA, 0.14 parts by weight of ALMA, 0.4 parts by weight of SDBS, and 0.002 parts by weight of CHP were introduced into the glass reaction vessel, and 0.0056 parts by weight of EDTA, 0.0014 parts by weight of ferrous sulfate heptahydrate, and 0.2 parts by weight of SFS were further introduced into the glass reaction vessel. The glass reaction vessel had a thermometer, a stirrer, a reflux condenser, a nitrogen inlet, a monomer adding device, and an emulsifying agent adding device. Next, the temperature inside the glass reaction vessel was raised to 60° C. Next, 0.15 parts by weight of SDBS was added into the system and stirred for 30 minutes. Next, 61.7 parts by weight of BA and 1.26 parts by weight of ALMA were added into the system, and then 0.15 parts by weight of SDBS was added into the system three times at 60-minute intervals. Next, a mixture of 25 parts by weight of MMA, 5 parts by weight of GMA, and 0.08 parts by weight of TBP was continuously added into the system over 180 minutes. Then, 0.04 parts by weight of TBP was added into the system, and stirred for another 30 minutes to finish polymerization. In this way, an aqueous latex (L-6) containing a core-shell polymer was obtained. The volume-average particle size of the core-shell polymer contained in the aqueous latex thus obtained was 97 nm.

Next, the same operations as described in Production Example 1 were carried out, except that the aqueous latex (L-6) was used instead of the aqueous latex (L-1). In this way, an MEK dispersion (dehydrated) (M-6) was obtained. The amount of water contained in 100 weight % of the MEK dispersion (dehydrated) (M-6) was 0.12 weight %. The dielectric dissipation factor of the obtained core-shell polymer particles was 0.0170.

TABLE 2

|  |  | Unit | Production Example 1 | Production Example 2 | Production Example 3 | Production Example 4 | Production Example 5 | Production Example 6 |
|---|---|---|---|---|---|---|---|---|
| Core | Polybutadiene | part by weight | 80 |  |  |  |  |  |
|  | Styrene-butadiene (Weight of styrene unit: weight of butadiene unit = 25:75) | part by weight |  | 80 | 80 |  |  |  |
|  | Crosslinked styrene (Weight of styrene unit: weight of allyl methacrylate unit = 75:1.5) | part by weight |  |  |  | 76.5 |  |  |
|  | Butyl acrylate | part by weight |  |  |  |  | 70 | 70 |
| Intermediate layer | Triallyl isocyanurate | part by weight |  | 2 | 2 |  |  |  |
| Shell | Styrene | part by weight | 2 | 12 | 12 |  |  |  |
|  | Acrylonitrile | part by weight | 1 | 4 | 4 |  |  |  |
|  | Methyl methacrylate | part by weight | 12 |  | 4 | 20 | 25 | 25 |
|  | Glycidyl methacrylate | part by weight | 5 | 4 |  | 5 | 5 | 5 |
| Volume-average particle size |  | nm | 210 | 110 | 110 | 122 | 500 | 97 |
| Amount of styrene contained in 100 parts by weight of core-shell polymer particles |  | part by weight | 2 | 32 | 32 | 75 | 0 | 0 |

Examples 1 to 5, Comparative Examples 1 and 2, and Reference Example 1

Components as shown in Table 3 were dissolved and mixed or were dispersed in methyl ethyl ketone at room temperature (25° C.) so that the solid content concentration would be 50 weight %, and thereby a resin varnish was obtained.

Glass cloth was immersed in the obtained resin varnish, and was thereby impregnated with the resin varnish. Then, the glass cloth was dried at 130° C. for 5 minutes. In this way, a prepreg (resin content: 50 mass %) was obtained.

Next, eight sheets of the obtained prepreg were stacked together to obtain a first laminate. Sheets of copper foil (HS2-VSP (Rz=1 μm) or MLS-G (Rz=3.8 μm)) having a thickness of 35 μm were placed on both faces of the first laminate to obtain a second laminate. The second laminate was heated at 200° C. for 90 minutes under a pressure of 4 MPa to obtain a metal-clad laminate having a thickness of 1.6 mm.

The obtained metal-clad laminate was measured for 90-degree metal foil peel strength, and then measured for Tg and $G_1c$. Furthermore, the dielectric dissipation factor of an insulating layer was measured with use of the obtained metal-clad laminate. The results obtained by the measurements are shown in Table 3.

TABLE 3

|  |  |  | Unit | Example 1 | Example 2 | Example 3 | Example 4 | Example 5 | Comparative Example 1 | Comparative Example 2 | Reference Example 1 |
|---|---|---|---|---|---|---|---|---|---|---|---|
| Compositions | Resin (A) | Type | — | A-1 | A-1 | A-1 | A-1 | A-1 | A-1 | A-1 | A-1 |
|  |  | Amount contained | part by weight | 65 | 65 | 65 | 65 | 65 | 70 | 65 | 70 |
|  | Core-shell polymer particles (B) | Type | — | Production Example 1 | Production Example 2 | Production Example 3 | Production Example 4 | Production Example 6 | — | Production Example 5 | — |
|  |  | Amount contained | part by weight | 5 | 5 | 5 | 5 | 5 | 0 | 5 | 0 |
|  | Reaction initiator | Amount contained | part by weight | 1 | 1 | 1 | 1 | 1 | 1 | 1 | 1 |
|  | Inorganic filler (D) | Amount contained | part by weight | 30 | 30 | 30 | 30 | 30 | 30 | 30 | 30 |
|  | Rz of metal foil |  | μm | 1 | 1 | 1 | 1 | 1 | 1 | 1 | 3.8 |
| Physical properties | 90-Degree metal foil peel strength |  | N/mm | 0.56 | 0.60 | 0.53 | 0.44 | 0.49 | 0.40 | 0.42 | 0.65 |
|  | Glass transition temperature (Tg) |  | ° C. | 216 | 217 | 216 | 216 | 216 | 216 | 217 | 216 |

TABLE 3-continued

|  | Unit | Example 1 | Example 2 | Example 3 | Example 4 | Example 5 | Comparative Example 1 | Comparative Example 2 | Reference Example 1 |
|---|---|---|---|---|---|---|---|---|---|
| Interlaminar fracture toughness ($G_{IC}$) | kJ/m² | 0.46 | 0.43 | 0.33 | 0.43 | 0.41 | 0.30 | 0.40 | 0.30 |
| Dielectric dissipation factor of insulating layer | — | 0.0076 | 0.0074 | 0.0073 | 0.0073 | 0.0078 | 0.0074 | 0.0078 | 0.0074 |

* Values indicated in the unit of part by weight are those of solid content.

Comparative Example 1 is much lower in 90-degree metal foil peel strength than Reference Example 1. This is attributed to the fact that the copper foil used in Comparative Example 1 has an Rz smaller than the copper foil used in Reference Example 1 and that adhesiveness brought about by anchor effect is difficult to obtain. The results show that, with regard to Examples 1 to 5 in which core-shell polymer particles (B) having a specific particle size were used, (a) 90-degree metal foil peel strength was better than that of Comparative Example 1 and (b) Tg (indicator of heat resistance) was equal to or higher than that of Comparative Example 1. The core-shell polymer particles (B) used in Example 5 and those used in Comparative Example 2 were equal in composition to each other and were different only in terms of particle size. With regard to Example 5 in which the core-shell polymer particles (B) having an average particle size of 97 nm were used, the metal foil peel strength is much better than that of Comparative Example 1. The results show that, however, with regard to Comparative Example 2 in which the core-shell polymer particles (B) having an average particle size of 500 nm were used, the metal foil peel strength was only slightly better than that of Comparative Example 1. It is inferred that this is because the core-shell polymer particles could not effectively enter the recesses in the metal foil (Rz=1) used and therefore, in the resin in the recesses, the core-shell polymer particles contributed only a little to an improvement in extension of the resin.

Examples 6 and 7 and Comparative Examples 3 and 4

The same operations as those for Example 1 were carried out, except that components as shown in Table 4 were dissolved and mixed or were dispersed in methyl ethyl ketone at room temperature (25° C.) so that the solid content concentration would be 50 weight % to obtain a resin varnish. In this way, a metal-clad laminate was obtained.

The obtained metal-clad laminate was measured for 90-degree metal foil peel strength, and then measured for Tg and $G_1c$. Furthermore, the dielectric dissipation factor of an insulating layer was measured with use of the obtained metal-clad laminate. The results obtained by the measurements are shown in Table 4.

A comparison between Comparative Example 3 and Example 6 and a comparison between Comparative Example 4 and Example 7 show that, with regard to Examples 6 and 7 in which the core-shell polymer particles (B) having a specific particle size were added, (a) 90-degree metal foil peel strength is better than that of the corresponding Comparative Example and (b) Tg (indicator of heat resistance) is also equivalent to the Tg of the corresponding Comparative Example.

TABLE 4

|  |  |  | Unit | Example 6 | Example 7 | Comparative Example 3 | Comparative Example 4 |
|---|---|---|---|---|---|---|---|
| Compositions | Resin (A) | Type | — | A-2 | A-3 | A-2 | A-3 |
|  |  | Amount contained | part by weight | 65 | 45 | 70 | 50 |
|  | Core-shell polymer particles (B) | Type | — | Production Example 2 | Production Example 2 | Production Example 2 | Production Example 2 |
|  |  | Amount contained | part by weight | 5 | 5 | 0 | 0 |
|  | Reaction initiator | Amount contained | part by weight | 1 | 0 | 1 | 0 |
|  | Reaction catalyst | Amount contained | part by weight | 0 | 0.1 | 0 | 0.1 |
|  | Inorganic filler (D) | Amount contained | part by weight | 30 | 50 | 30 | 50 |
|  | Rz of metal foil |  | μm | 1 | 1 | 1 | 1 |
| Physical properties | 90-Degree metal foil peel strength |  | N/mm | 0.45 | 0.60 | 0.41 | 0.50 |
|  | Glass transition temperature (Tg) |  | ° C. | 200 | 240 | 200 | 240 |
|  | interlaminar fracture toughness ($G_{IC}$) |  | kJ/m² | 0.56 | 0.39 | 0.36 | 0.25 |
|  | Dielectric dissipation factor of insulating layer |  | — | 0.0081 | 0.0052 | 0.0083 | 0.0052 |

* Values indicated in the unit of part by weight are those of solid content.

One or more embodiments of the present invention make it possible to provide a metal-clad laminate that is excellent in adhesiveness between a substrate and metal foil and that also has good dielectric characteristics and heat resistance. One or more embodiments of the present invention are therefore suitably applicable to electronic components for use in electronic devices such as servers, millimeter-wave radar, and mobile devices.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

The invention claimed is:

1. A metal-clad laminate comprising:
an insulating layer including a resin composition and a fibrous base material; and
metal foil in contact with the insulating layer,
wherein the resin composition contains:
a resin (A) having a dielectric dissipation factor (Df) of not more than 0.0100 at 10 GHz, and core-shell polymer particles (B) having a volume-average particle size of 10 nm to 400 nm;
the core-shell polymer particles (B) include a shell layer that contains an epoxy group; and
a surface of the metal foil has a ten-point average roughness (Rz) of not more than 2.0 µm.

2. The metal-clad laminate according to claim 1, wherein:
the core-shell polymer particles (B) include a core layer composed of a rubber elastic body obtained by polymerizing (i) not less than 50 weight % and not more than 100 weight % of at least one type of monomer selected from the group consisting of diene-based monomers and (meth)acrylic ester-based monomers and (ii) not less than 0% and not more than 50 weight % of a copolymerizable vinyl monomer which is different from the at least one type of monomer, and
the copolymerizable vinyl monomer is at least one type of monomer selected from the group consisting of aromatic vinyl compounds, vinyl cyanide compounds, unsaturated carboxylic acid derivatives, (meth)acrylamide derivatives, and maleimide derivatives.

3. The metal-clad laminate according to claim 1, wherein not less than 30 weight % in 100 weight % of the core-shell polymer particles (B) is composed of styrene unit.

4. The metal-clad laminate according to claim 1, wherein the resin (A) includes a polyphenylene ether that contains a crosslinkable functional group.

5. The metal-clad laminate according to claim 4, wherein the polyphenylene ether is a modified polyphenylene ether which has a terminal modified with a substituent containing an unsaturated carbon-carbon double bond.

6. A printed wiring board produced with the metal-clad laminate recited in claim 1.

7. The metal-clad laminate according to claim 2, wherein not less than 30 weight % in 100 weight % of the core-shell polymer particles (B) is composed of styrene unit.

8. The metal-clad laminate according to claim 2, wherein the resin (A) includes a polyphenylene ether that contains a crosslinkable functional group.

9. The metal-clad laminate according to claim 3, wherein the resin (A) includes a polyphenylene ether that contains a crosslinkable functional group.

10. A metal-clad laminate comprising:
an insulating layer including a resin composition and a fibrous base material; and
metal foil which is in contact with the insulating layer,
wherein:
the insulating layer has a dielectric dissipation factor (Df) of not more than 0.0100 at 10 GHz,
a surface of the metal foil has a ten-point average roughness (Rz) of not more than 2.0 µm, and
the metal-clad laminate has a 90-degree metal foil peel strength of not less than 0.43 N/mm and an interlaminar fracture toughness ($G_1c$) of not less than 0.38 kJ/m$^2$, the 90-degree metal foil peel strength being measured in accordance with JIS C6481, the interlaminar fracture toughness ($G_1c$) being measured in accordance with ISO15024.

11. The metal-clad laminate according to claim 10, wherein the resin composition contains core-shell polymer particles (B) having a volume-average particle size of 10 nm to 400 nm.

12. A printed wiring board produced with the metal-clad laminate recited in claim 10.

* * * * *